(12) United States Patent
Paudel et al.

(10) Patent No.: US 9,496,040 B2
(45) Date of Patent: Nov. 15, 2016

(54) ADAPTIVE MULTI-PAGE PROGRAMMING METHODS AND APPARATUS FOR NON-VOLATILE MEMORY

(71) Applicant: SanDisk Technologies Inc., Plano, TX (US)

(72) Inventors: Rajan Paudel, Fremont, CA (US); Jagdish Sabde, Fremont, CA (US); Sagar Magia, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/602,468

(22) Filed: Jan. 22, 2015

(65) Prior Publication Data

US 2016/0217857 A1 Jul. 28, 2016

(51) Int. Cl.
*G11C 16/10* (2006.01)

(52) U.S. Cl.
CPC ..................... *G11C 16/10* (2013.01)

(58) Field of Classification Search
CPC ...................................... G11C 16/10
USPC ................................... 365/185.19
See application file for complete search history.

(56) References Cited

U.S. PATENT DOCUMENTS

| | | | | |
|---|---|---|---|---|
| 8,036,044 B2* | 10/2011 | Dong | .................. | G11C 16/16 |
| | | | | 365/185.18 |
| 8,045,384 B2* | 10/2011 | Dong | .................. | G11C 16/10 |
| | | | | 365/185.17 |
| 2008/0123426 A1* | 5/2008 | Lutze | .................. | G11C 16/3418 |
| | | | | 365/185.17 |
| 2009/0080263 A1* | 3/2009 | Lee | .................. | G11C 11/5628 |
| | | | | 365/185.19 |
| 2009/0310421 A1* | 12/2009 | Cernea | .................. | G11C 11/5628 |
| | | | | 365/185.19 |
| 2009/0323429 A1* | 12/2009 | Lee | .................. | G11C 11/5628 |
| | | | | 365/185.19 |

* cited by examiner

*Primary Examiner* — Hoai V Ho
*Assistant Examiner* — Muna A Techane
(74) *Attorney, Agent, or Firm* — Vierra Magen Marcus LLP

(57) ABSTRACT

A method is provided for programming a memory cell connected to a selected word line in a memory device. The method includes performing one programming pass of a multi-pass programming operation for the memory cell, wherein a first set of program pulses is applied to the selected word line during the one programming pass, determining a number of the program pulses applied to the selected word line during the one programming pass, determining a difference between the determined number of program pulses applied to the selected word line during the one programming pass and a predetermined number of program pulses, adjusting a parameter of a second set of program pulses for the another programming pass based on the determined difference, and performing the another programming pass for the set of memory cells, wherein the second set of program pulses is applied to the selected word line during the another programming pass.

22 Claims, 23 Drawing Sheets

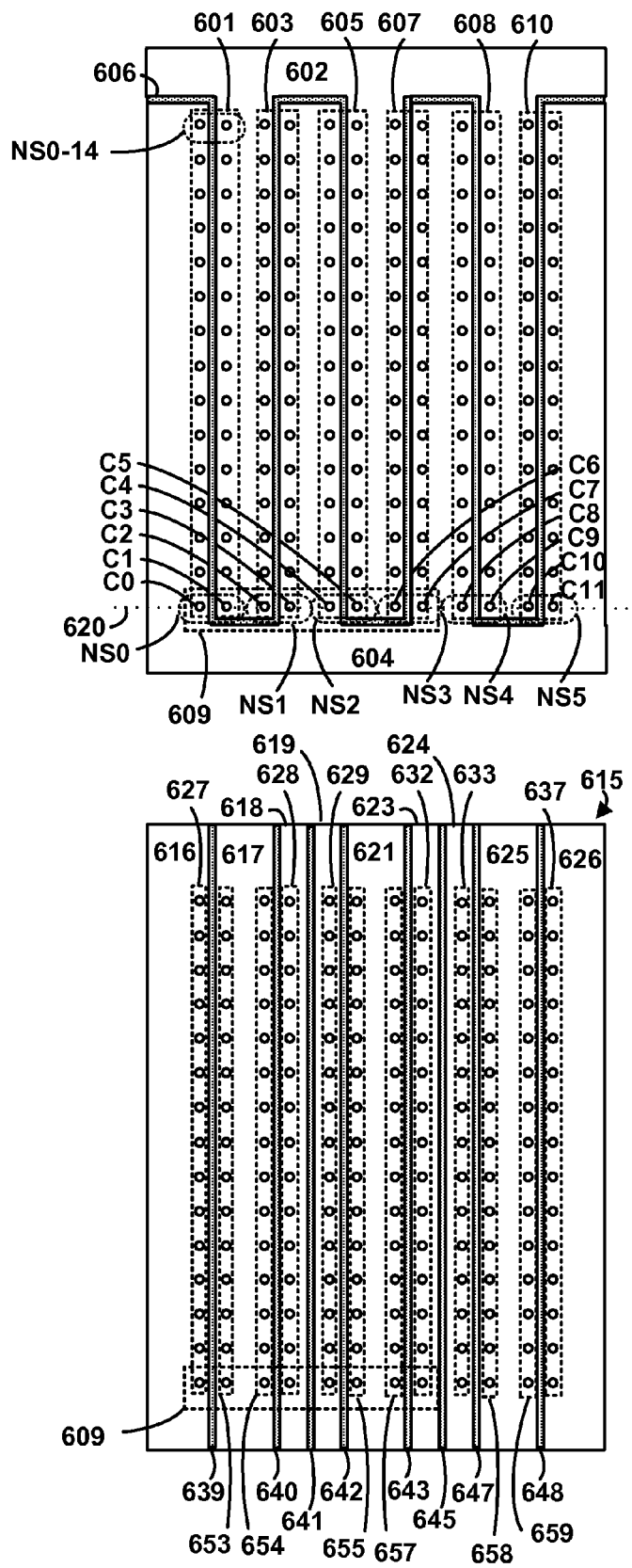

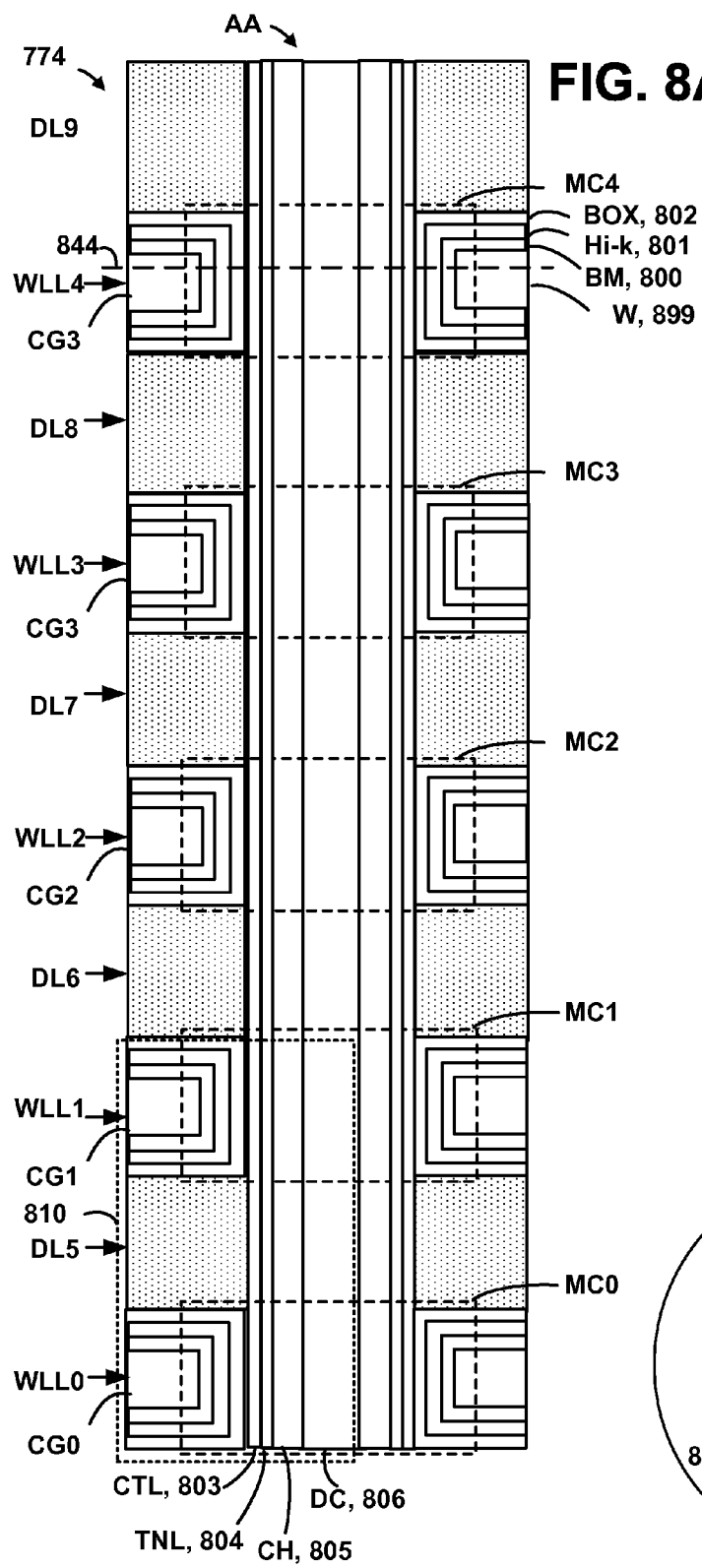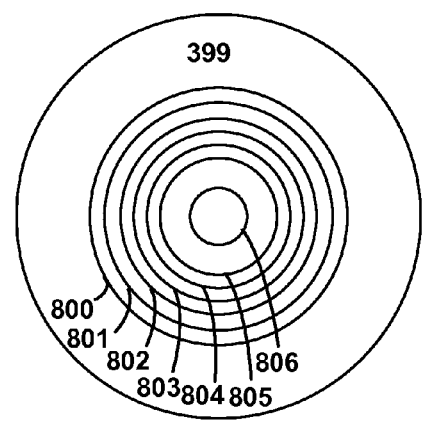

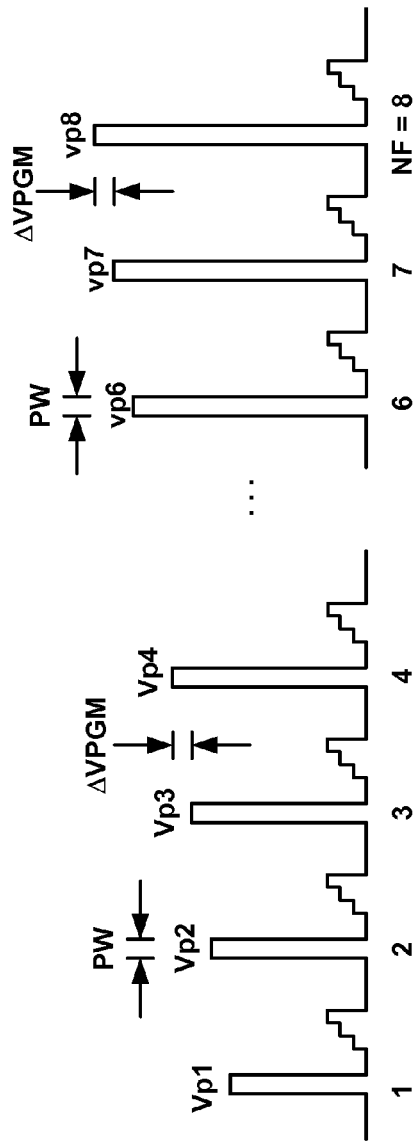
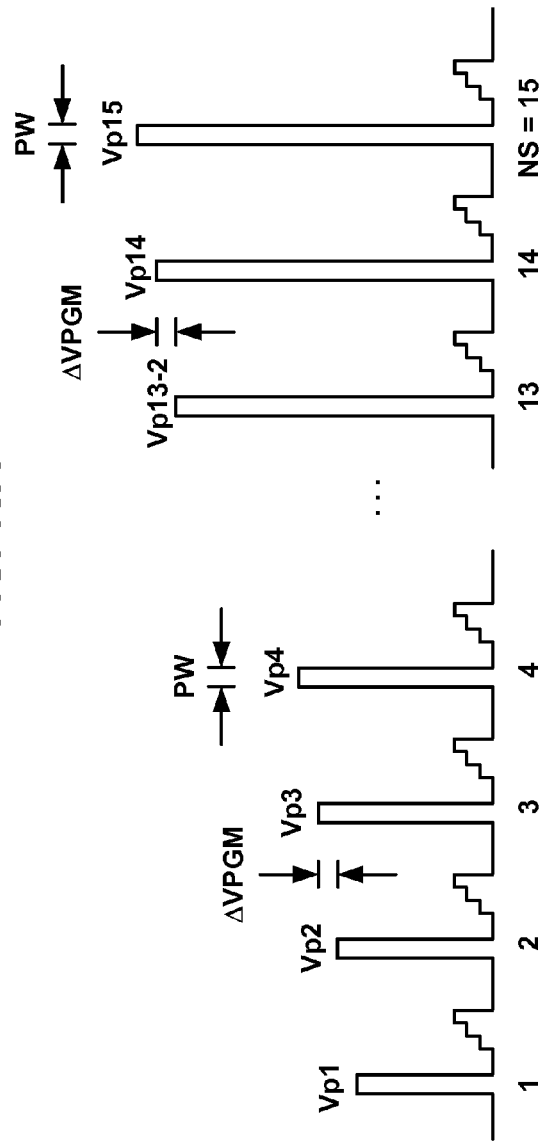
FIG. 13A
FIG. 13B

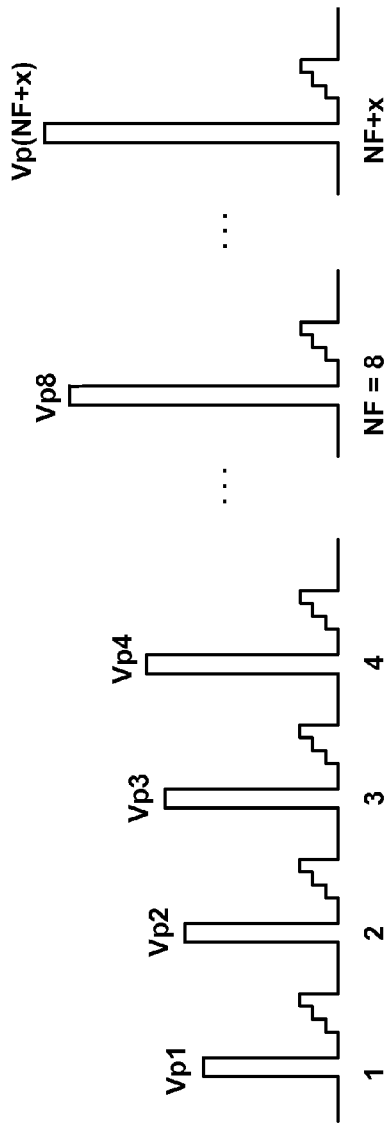
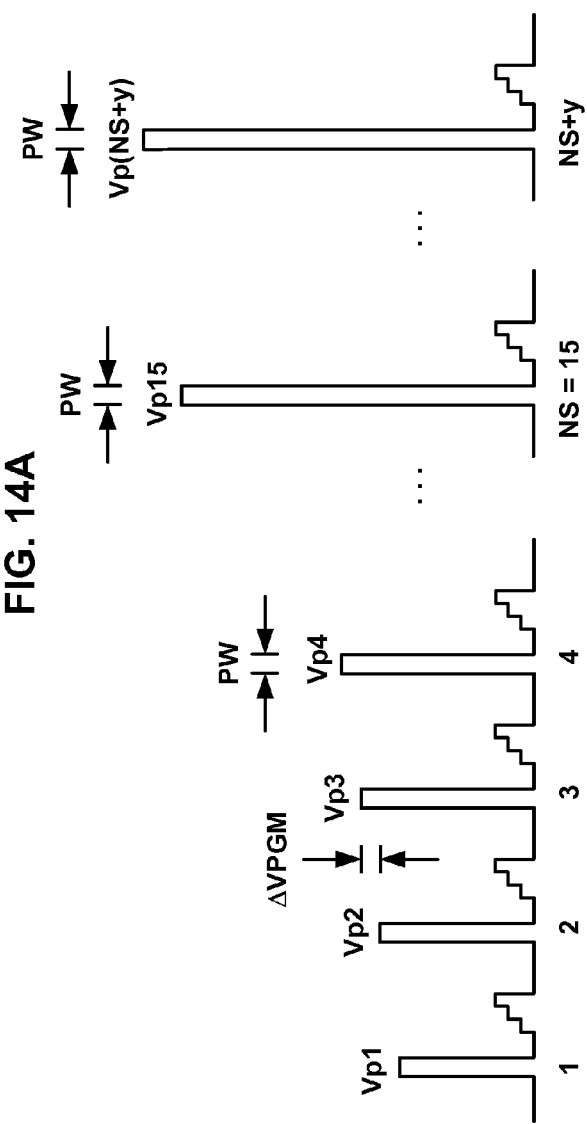
FIG. 14A
FIG. 14B

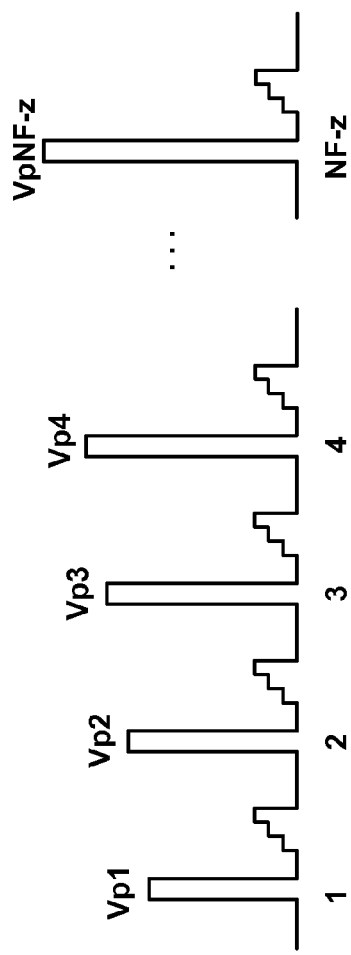
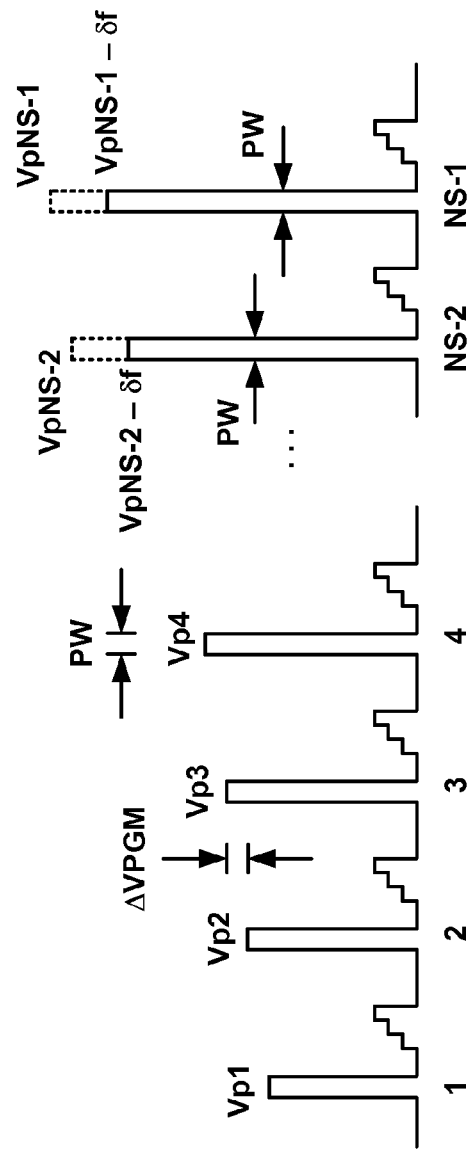
FIG. 18A
FIG. 18B

ADAPTIVE MULTI-PAGE PROGRAMMING METHODS AND APPARATUS FOR NON-VOLATILE MEMORY

BACKGROUND

The present technology relates to non-volatile memory.

Semiconductor memory devices have become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories.

In such memory devices, a memory cell can include a floating gate that is positioned above and insulated from a channel region in a semiconductor substrate, in a two-dimensional (2D) NAND configuration. The floating gate is positioned between source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. A memory cell can have a floating gate that is used to store two or more ranges of charges, where each range represents a data state.

Moreover, ultra high density storage devices have been proposed using a three-dimensional (3D) stacked memory structure which is formed from an array of alternating conductive and dielectric layers. One example is the Bit Cost Scalable (BiCS) architecture. A memory hole is drilled in the layers, and a NAND string is formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

Techniques are need for accurately programming a memory device.

BRIEF DESCRIPTION OF THE DRAWINGS

FIGS. 6A-6C depict various view of a U-shaped NAND embodiment, as an example implementation of BLK0 in FIG. 5.

FIG. 8A depicts a view of the region 774 of FIG. 7C, showing memory cells MC1 to MC5.

FIG. 8B depicts a cross-section view of the region 774 of FIG. 4A along line 444.

FIGS. 13A and 13B depict a series of program and verify pulses which are applied to a selected word line during a two-pass programming operation, such as depicted in FIG. 12.

FIGS. 14A and 14B depict another embodiment of a series of program and verify pulses which are applied to a selected word line during a two-pass programming operation, such as depicted in FIG. 12.

FIGS. 18A and 18B depict another embodiment of a series of program and verify pulses which are applied to a selected word line during the programming operation of FIG. 16.

DETAILED DESCRIPTION

Programming techniques are provided to reduce program disturb in a memory device. In particular, multi-pass programming techniques are provided to reduce program disturb for slow-to-program and fast-to-program memory cells.

During a programming operation, data can be programmed into memory cells in multiple programming passes. The programming increases the threshold voltages of the memory cells according to a data states to be programmed into the cells. In some cases, a back and forth word line order is used in which one word line is partly programmed, then another word line is partly programmed and so forth, until all word lines are fully programmed. This approach can minimize capacitive coupling effects which could inadvertently change the threshold voltages of the memory cells.

An adaptive multi-pass programming technique is provided. In particular, a memory cell on a selected word line is programmed in one programming pass to a specified threshold state. During the one programming pass, the number of programming pulses required to program the memory cell to the specified threshold state is determined. The difference between the determined number of programming pulses and an average number of programming pulses for the one programming pass and the specified threshold state is determined, and the difference is used to adaptively adjust programming pulse parameters for the memory cells in another programming pass.

Figure 1:
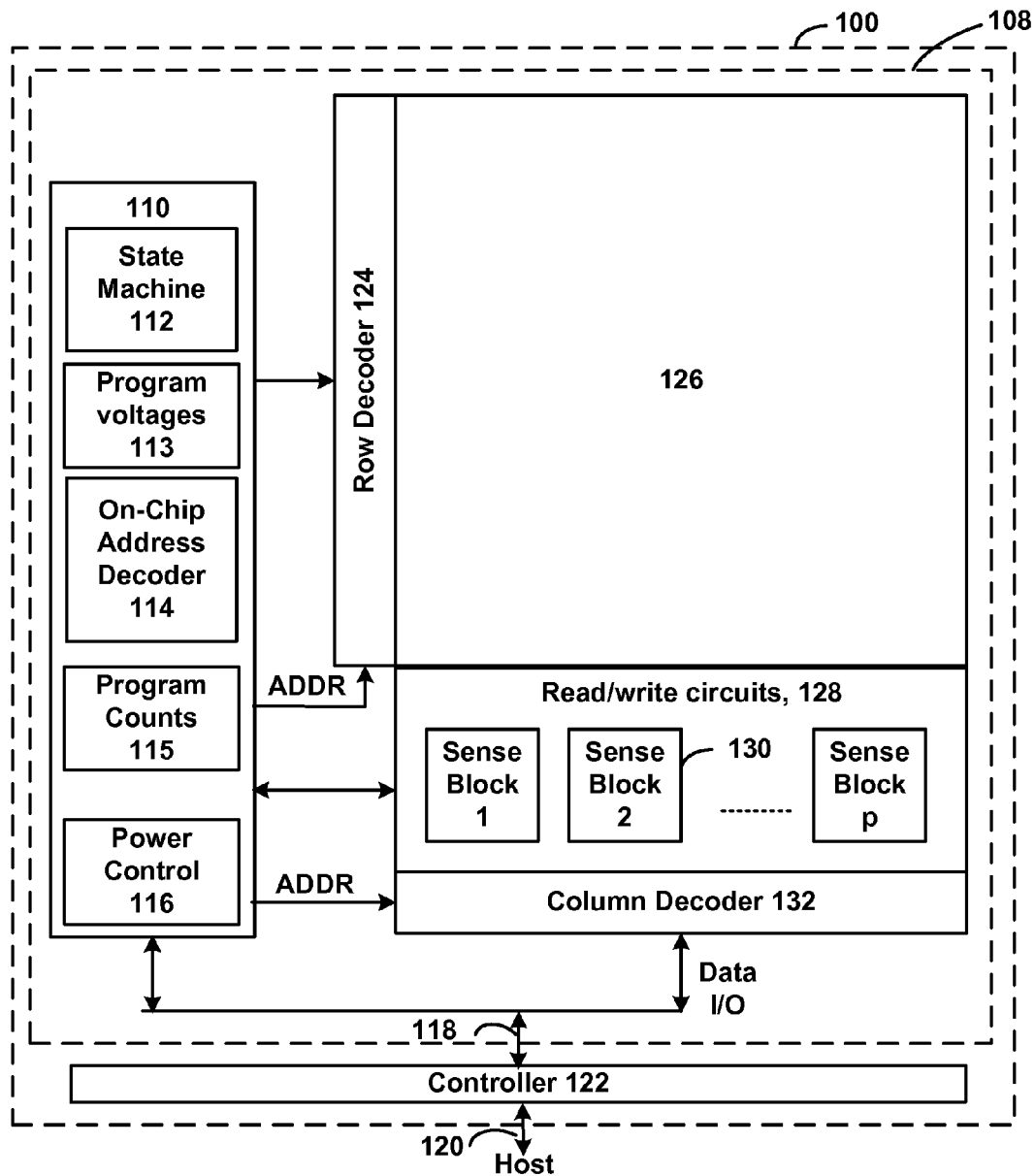
FIG. 1 is a block diagram of an embodiment of a non-volatile memory system.

FIG. 1 is a block diagram of a non-volatile memory system 100, which may include one or more memory die 108. Memory die 108 includes a memory structure 126 of memory cells, control circuitry 110, and read/write circuits 128. Memory structure 126 is addressable by word lines via a row decoder 124 and by bit lines via a column decoder 132. Read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between a host and controller 122 via lines 120 and between controller 122 and the one or more memory die 108 via lines 118.

Memory structure 126 may include one or more arrays of memory cells including a 2D array and/or a 3D array, as described in more detail below. In some embodiment, memory structure 126 may include a monolithic 3D memory array in which multiple memory levels are formed above (and not in) a single substrate, such as a wafer, with no intervening substrates. Memory structure 126 may include any type of non-volatile memory that is monolithically formed in one or more physical levels of arrays of memory cells having an active area disposed above a silicon substrate. Memory structure 126 may be in a non-volatile memory device having circuitry associated with the operation of the memory cells, whether the associated circuitry is above or within the substrate.

Control circuitry 110 cooperates with read/write circuits 128 to perform memory operations on memory structure 126, and includes a state machine 112, an on-chip address decoder 114, and a power control module 116. State machine 112 provides chip-level control of memory operations. A storage region 113 may be provided for program voltages in the memory device, such as Vpgm voltage values to be used in one or more programming passes. A storage location 115 such as a data register can be used to store data for programming, such as a number of program pulses applied to a memory cell.

On-chip address decoder 114 provides an address interface between that used by the host or a memory controller to the hardware address used by decoders 124 and 132. Power control module 116 controls the power and voltages supplied to the word lines and bit lines during memory operations. Power control module 116 may include drivers for word line layers (WLLs) in a 3D configuration, SGS and SGD transistors and source lines. Sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

Memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

Figure 2A:
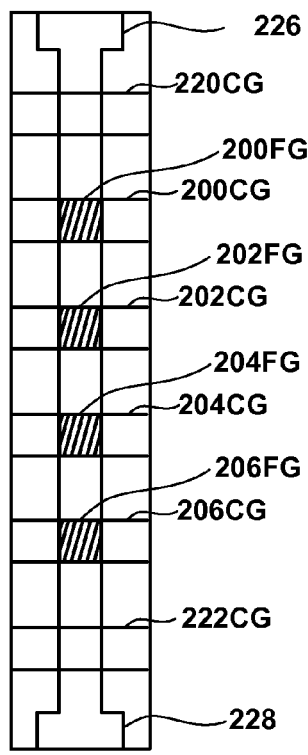
FIG. 2A is a top view of an embodiment of a NAND string.
Figure 2B:
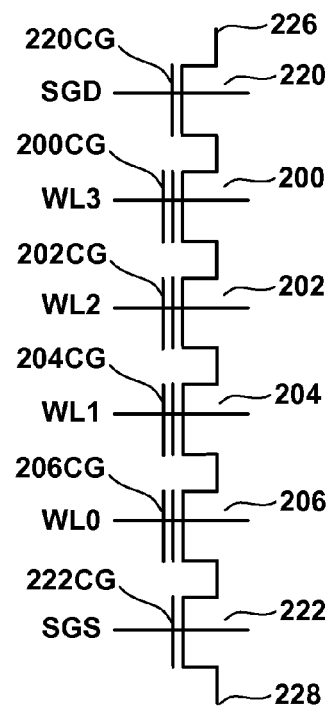
FIG. 2B is an equivalent circuit diagram of the NAND string of FIG. 2A.

FIG. 2A is a top view showing of an example 2D NAND string, and FIG. 2B is an equivalent circuit thereof. The 2D NAND string depicted includes four transistors 200, 202, 204 and 206 in series and sandwiched between a first select gate 220 and a second select gate 222. Select gate 220 connects the NAND string to bit line 226. Select gate 222 connects the NAND string to source line 228. Select gate 220 is controlled by applying the appropriate voltages to control gate 220CG. Select gate 222 is controlled by applying the appropriate voltages to control gate 222CG.

Each of transistors 200, 202, 204 and 206 has a control gate and a floating gate. Transistor 200 has control gate 200CG and floating gate 200FG. Transistor 202 includes control gate 202CG and floating gate 202FG. Transistor 204 includes control gate 204CG and floating gate 204FG. Transistor 206 includes a control gate 206CG and floating gate 206FG. Control gate 200CG is connected to word line WL3, control gate 202CG is connected to word line WL2, control gate 204CG is connected to word line WL1, and control gate 206CG is connected to word line WL0.

In an embodiment, transistors 200, 202, 204 and 206 are each memory cells. In other embodiments, the memory cells may include multiple transistors or may be different than that depicted. Select gate 220 is connected to select line SGD. Select gate 222 is connected to select line SGS.

Figure 3:
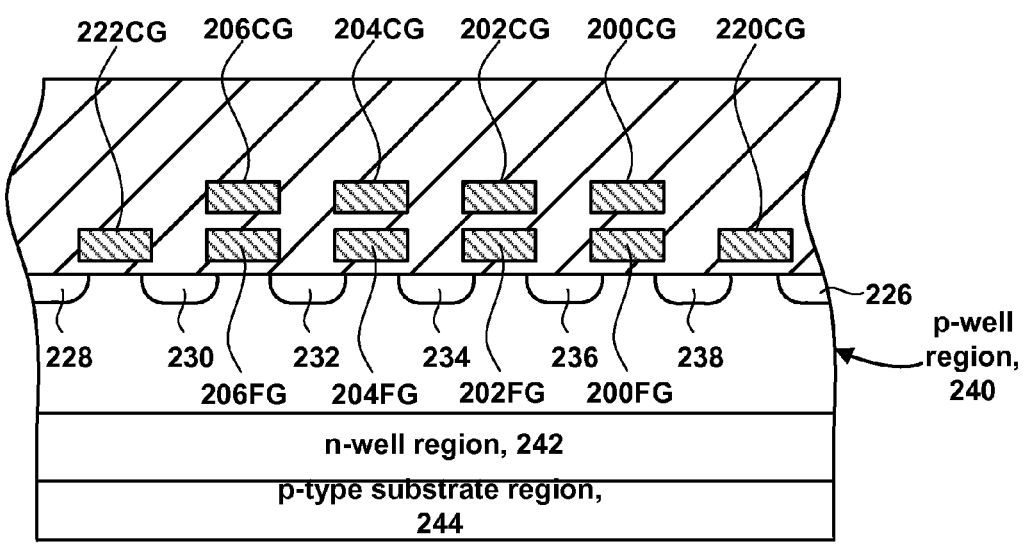
FIG. 3 is a cross-sectional view of the NAND string of FIG. 2A.

FIG. 3 provides a cross-sectional view of the NAND string described above. The transistors of the NAND string are formed in p-well region 240. The p-well region in turn may be within an n-well region 242 of a p-type substrate 244. Each transistor includes a stacked gate structure that consists of a control gate (200CG, 202CG, 204CG and 206CG) and a floating gate (200FG, 202FG, 204FG and 206FG). The floating gates are formed on the surface of the p-well on top of an oxide or other dielectric film. The control gate is above the floating gate, with an inter-polysilicon dielectric layer separating the control gate and floating gate.

The control gates of the memory cells (200, 202, 204 and 206) form the word lines. N+ doped layers 230, 232, 234, 236 and 238 are shared between neighboring cells, whereby the cells are connected to one another in series to form a NAND string. These N+ doped layers form the source and drain of each of the cells.

For example, N+ doped layer 230 serves as the drain of transistor 222 and the source for transistor 206, N+ doped layer 232 serves as the drain for transistor 206 and the source for transistor 204, N+ doped layer 234 serves as the drain for transistor 204 and the source for transistor 202, N+ doped layer 236 serves as the drain for transistor 202 and the source for transistor 200, and N+ doped layer 238 serves as the drain for transistor 200 and the source for transistor 220. N+ doped layer 226 connects to the bit line for the NAND string, while N+ doped layer 228 connects to a common source line for multiple NAND strings.

Note that although FIGS. 2A, 2B and 3 show four memory cells in the NAND string, a NAND string used with the technology described herein can have fewer than four memory cells or more than four memory cells. For example, some NAND strings will include 8, 16, 32 or more memory cells.

Figure 4:
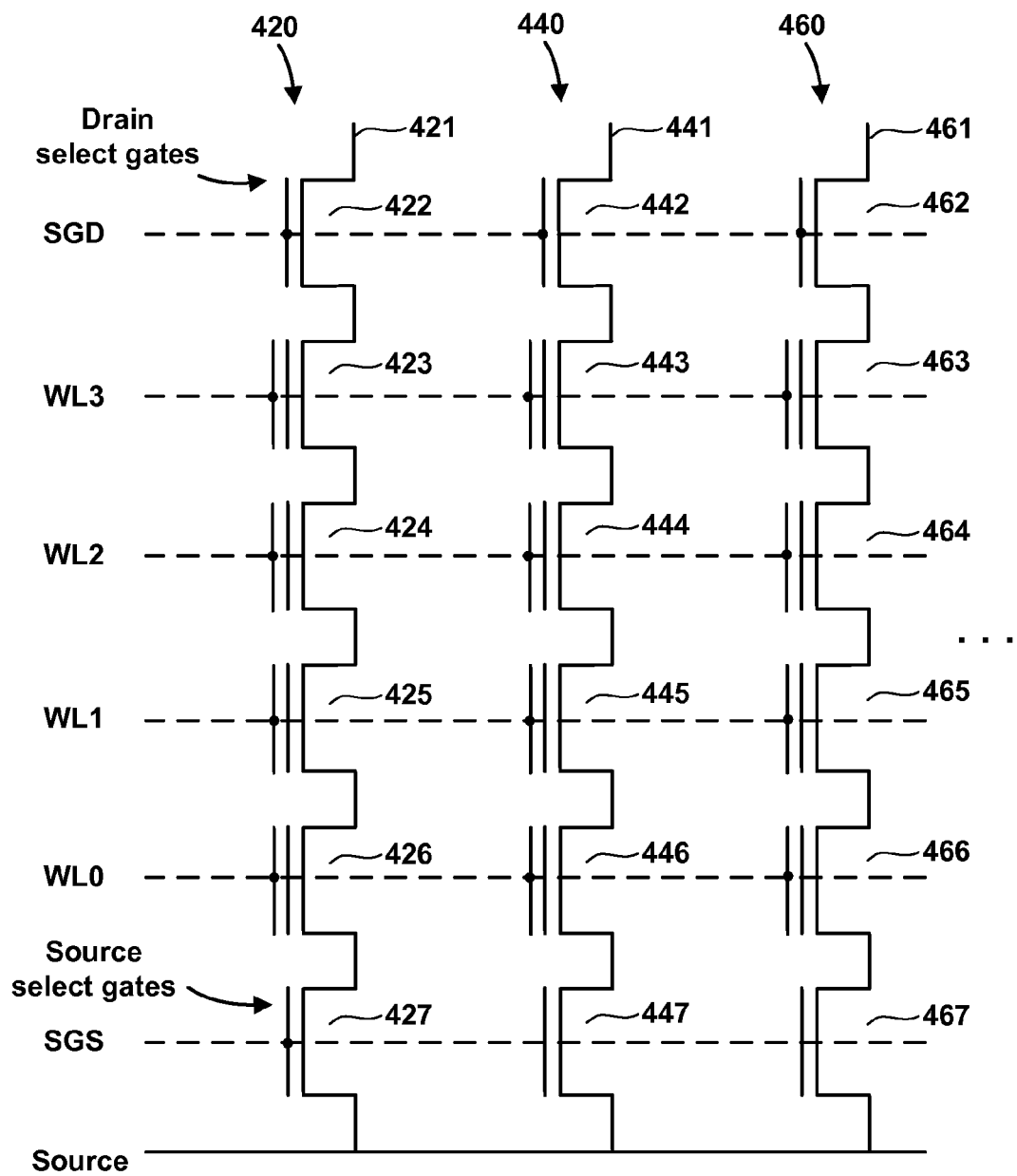
FIG. 4 is a circuit diagram depicting an embodiment of three NAND strings.

FIG. 4 is a circuit diagram depicting three NAND strings. A typical architecture for a flash memory system using a NAND structure will include several NAND strings. For example, three NAND strings 420, 440 and 460 are shown in a memory array having many more NAND strings. Each of the NAND strings includes two select gates and four memory cells. Although four memory cells are illustrated for simplicity, modern NAND strings can have up to thirty-two or sixty-four memory cells, for instance.

For example, NAND string 420 includes select gates 422 and 427, and memory cells 423-426, NAND string 440 includes select gates 442 and 447, and memory cells 443-446, NAND string 460 includes select gates 462 and 467, and memory cells 463-466. Each NAND string is connected to the source line by its select gates (e.g., select gates 427, 447 or 467). A selection line SGS is used to control the source side select gates.

The various NAND strings 420, 440 and 460 are connected to respective bit lines 421, 441 and 461, by select transistors in the select gates 422, 442, 462, respectively. These select transistors are controlled by a drain select line SGD. In other embodiments, the select lines do not necessarily need to be in common among the NAND strings. That is, different select lines can be provided for different NAND strings.

Word line WL3 is connected to the control gates for memory cells 423, 443 and 463. Word line WL2 is connected to the control gates for memory cells 424, 444 and 464. Word line WL1 is connected to the control gates for memory cells 425, 445 and 465. Word line WL0 is connected to the control gates for memory cells 426, 446 and 466. As can be seen, each bit line and the respective NAND string comprise the columns of the array or set of memory cells. The word lines (WL3, WL2, WL1 and WL0) comprise the rows of the array or set.

Each word line connects the control gates of each memory cell in the row. Or, the control gates may be provided by the word lines themselves. For example, word line WL2 provides the control gates for memory cells 424, 444 and 464. In practice, there can be thousands of memory cells on a word line.

When programming a flash memory cell, a program voltage, usually a series of voltage pulses, is applied to the control gate of the memory cell, and the bit line associated with the memory cell is grounded. Electrons from the channel are injected into the floating gate. When electrons accumulate in the floating gate, the floating gate becomes negatively charged and the Vth of the memory cell is raised. To apply the program voltage to the control gate of the memory cell being programmed, that program voltage is applied on the appropriate word line. As discussed above, one memory cell in each of the NAND strings share the same word line. For example, when programming memory cell 424 of FIG. 4, the program voltage will also be applied to the control gates of memory cells 444 and 464.

However, program disturb can occur at inhibited NAND strings during programming of other NAND strings, and sometimes at the programmed NAND string itself. Program disturb occurs when the Vth of an unselected non-volatile memory cell is shifted due to programming of other non-volatile memory cells. Program disturb can occur on previously programmed memory cells as well as erased memory cells that have not yet been programmed. Various program disturb mechanisms can limit the available operating window for non-volatile storage devices such as NAND flash memory.

For example, if NAND string 420 is inhibited (e.g., it is an unselected NAND string which does not contain a memory cell which is currently being programmed) and NAND string 440 is being programmed (e.g., it is a selected NAND string which contains a memory cell which is currently being programmed), program disturb can occur at NAND string 420. For example, if a pass voltage is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the Vth of a charge memory cell due to capacitive coupling with other neighboring memory cells that are programmed later, can also contribute to program disturb.

Each memory cell can store data represented in analog or digital form. When storing one bit of digital data, the range of possible threshold voltages of the memory cell is divided into two ranges, which are assigned logical data "1" and "0." In an example of a NAND-type flash memory, the Vth is negative after the memory cell is erased, and defined as logic "1." The Vth is positive after a program operation, and defined as logic "0." When the Vth is negative and a read is attempted by applying 0 volts to the control gate, the memory cell will turn on to indicate logic one is being stored. When the Vth is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the Vth window is divided into the number of states. For example, if four states are used, there will be four Vth ranges assigned to the data values "11," "10," "01," and "00." In an example of a NAND-type memory, the Vth after an erase operation is negative and defined as "11." Positive threshold voltages are used for the states of "10," "01," and "00." In other embodiments, positive threshold voltages are used for all memory states.

In some implementations, the data values (e.g., logical states) are assigned to the threshold ranges using a Gray code assignment so that if the Vth of a floating gate erroneously shifts to its neighboring physical state, only one bit will be affected. The specific relationship between the data programmed into the memory cell and the Vth ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

As mentioned above, memory structure 126 of FIG. 1 also may include a 3D memory array. A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple two dimensional memory device levels. As another non-limiting example, a 3D memory array may be arranged as multiple vertical columns (e.g., columns extending substantially perpendicular to the major surface of the substrate, i.e., in the z-direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 5:
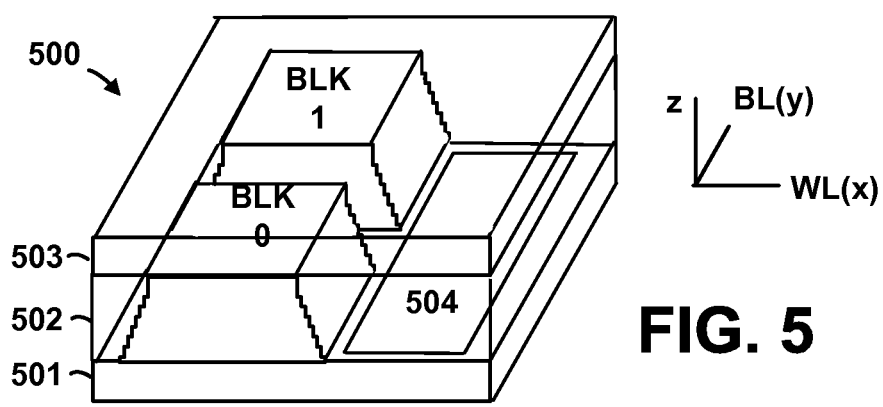
FIG. 5 is a perspective view of a 3D stacked non-volatile memory device.

FIG. 5 is a perspective view of an embodiment of a 3D stacked non-volatile memory device. The memory device 100 includes a substrate 101. On substrate 101 are example blocks BLK0 and BLK1 of memory cells and a peripheral area 104 with circuitry for use by the blocks. Substrate 101 also can carry circuitry under blocks BLK0 and BLK1, along with one or more lower metal layers which are patterned in conductive paths to carry signals of the circuitry. Blocks BLK0 and BLK1 are formed in an intermediate region 102 of memory device 100. In an upper region 103 of memory device 100, one or more upper metal layers are patterned in conductive paths to carry signals of the circuitry.

Blocks BLK0 and BLK1 each include a stacked area of memory cells, where alternating levels of the stack represent word lines. In one possible approach, each block has opposing tiered sides from which vertical contacts extend upward to an upper metal layer to form connections to conductive paths. Although two blocks BLK0 and BLK1 are depicted as an example, additional blocks can be used, extending in the x- and/or y-directions.

In one possible approach, the length of the plane, in the x-direction, represents a direction in which signal paths to word lines extend in the one or more upper metal layers (a word line direction), and the width of the plane, in the y-direction, represents a direction in which signal paths to bit lines extend in the one or more upper metal layers (a bit line direction). The z-direction represents a height of the memory device.

FIG. 6A depicts a top view of example word line layers 602 and 604 in a U-shaped NAND embodiment, as an example implementation of BLK0 in FIG. 5. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 6C:
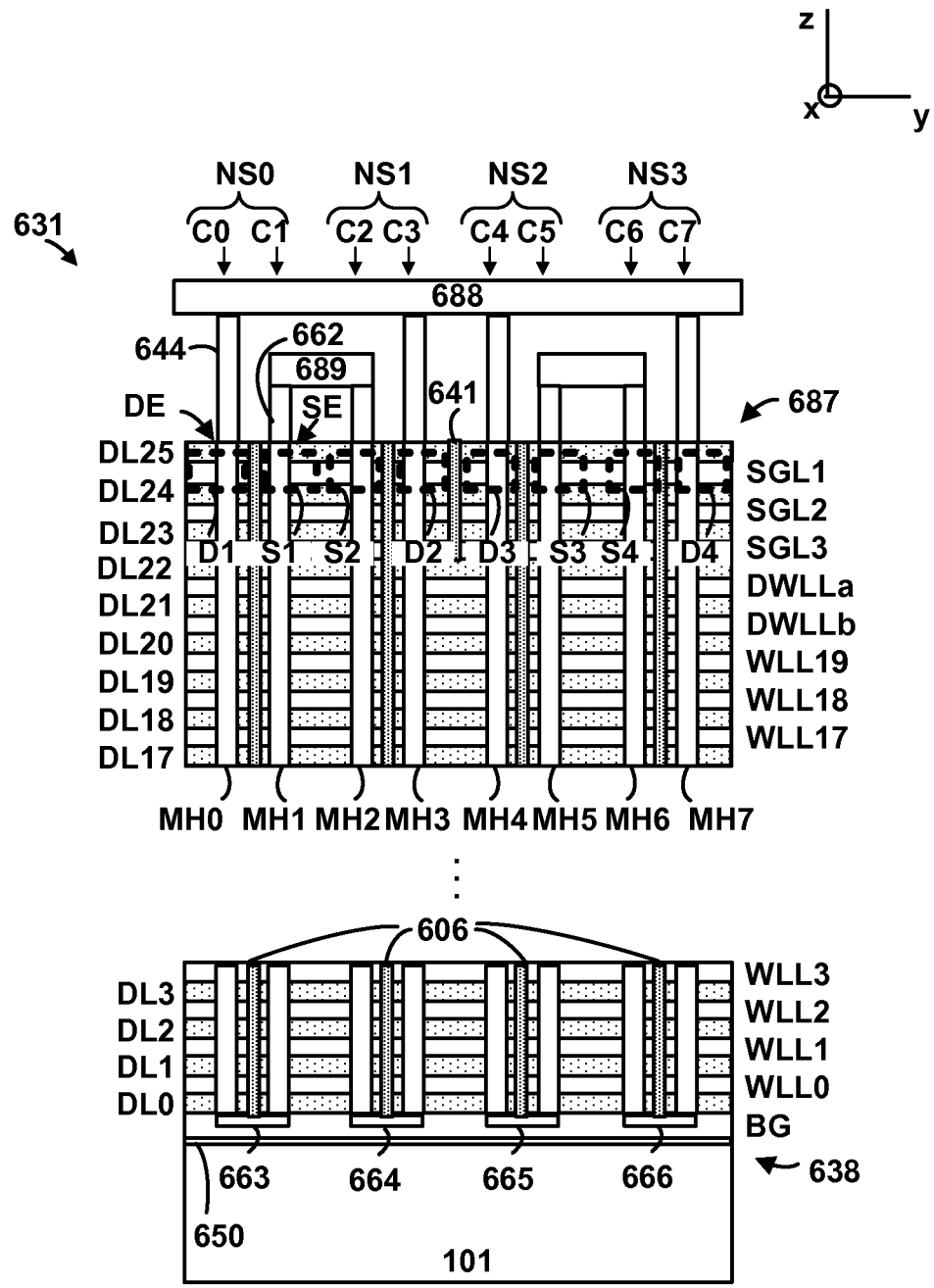

The view is of a representative layer among the multiple WLLs in a stack. Referring also to FIG. 6C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 6A may represent any one of the word line layers in FIG. 6C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 602 and 604 which are insulated from one another by a slit 606. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 606 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 620 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 6B. Regions 601, 603, 605, 607, 608 and 610 each represent a set of NAND strings, or a set of memory cells in a word line layer. For example, region 610 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32,000 memory columns in the x direction, for a total of 384,000 memory columns in a block. With U-shaped NAND strings, 192,000 NAND strings are provided in this example. With straight NAND strings, 384,000 NAND strings are provided in this example. Assuming there are twenty-four memory cells per column, there are 384,000×24=9,216,000 memory cells in the set.

FIG. 6B depicts a top view of example select gate layer portions, consistent with FIG. 6A. In one approach, the select gate layer 615 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 639, 640, 641, 642, 643, 645, 647 and 648. The slits extend partway down in the stack as depicted by example slit 641 in FIG. 6C. Regions 627, 628, 629, 632, 633 and 637 represent SGD transistors in SGD layer portions 616, 618, 619, 623, 624 and 626, respectively. Regions 653 and 654, 655 and 657, and 658 and 659 represent SGS transistors in SGS layer portions 617, 621 and 625, respectively. Regions 655 and 657, 658 and 659, represent SGS transistors in SGS layer portions 621 and 625, respectively. The portion 609 from FIG. 6A is repeated for reference.

The select gate transistors are associated with NAND strings NS0-NS5.

FIG. 6C depicts an embodiment of a stack 631 showing a cross-sectional view of the portion 609 of FIG. 6A, along line 620. This example includes three select gate layers, SGL1, SGL2 and SGL3. In this case, the slit extends down to DL22, so that three separate layers of select gate transistors are formed in each column of each NAND string. The stack has a top 687 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 644 connects a drain side of C0 and NS0 to a bit line 688. A via 662 connects a source side of C1 and NS0 to a source line 689. Back gates 663, 664, 665 and 666 are provided in NS0, NS1, NS2 and NS3, respectively.

Regions D1, D2, D3 and D4 represent SGD transistors and regions S1, S2, S3 and S4 represent SGS transistors, in SGL1.

Figure 7A:
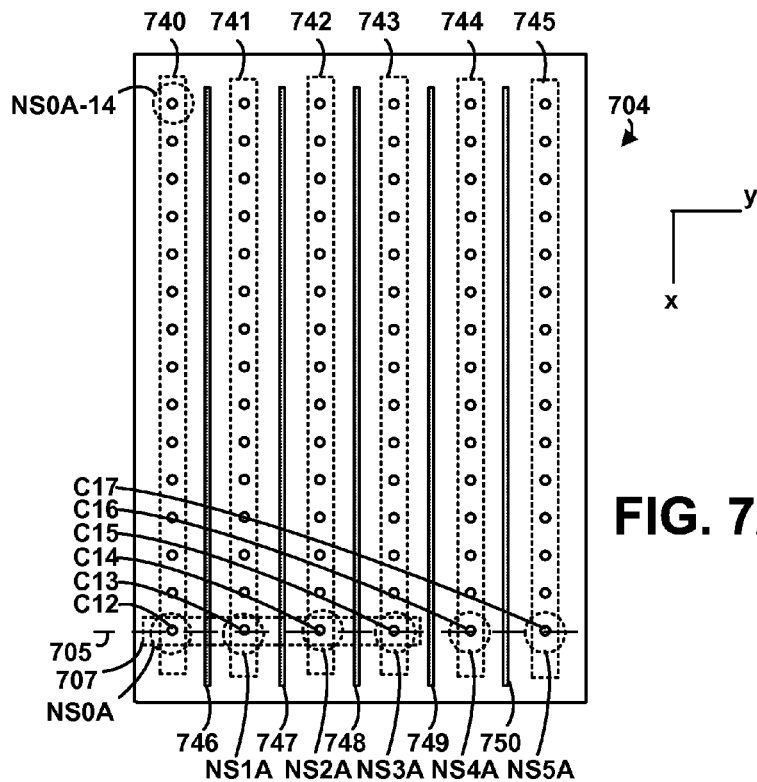
FIGS. 7A-7C depict various views of a straight NAND string embodiment, as an example word line layer of block BLK0 of FIG. 5.

FIG. 7A depicts a top view of an example word line layer 704 of the block BLK0 of FIG. 5, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 746, 747, 748, 749 and 750 can also be used in the fabrication process to provide structural support for the stack when undoped polysilicon layers are removed by a wet etch and a dielectric is deposited to form the alternating dielectric layers. A dashed line 705 extends through columns C12-C17. A cross-sectional view along line 705 of portion 707 is shown in FIG. 7C.

Regions 740, 741, 742, 743, 744 and 745 represent the memory cells (as circles) of respective sets of NAND strings. For example, region 740 represents memory cells in NAND strings NS0A, NS0A-14. Additional NAND strings include NS1A, NS2A, NS3A, NS4A and NS5A.

Alternatively, the layer 704 represents an SGS layer, in which case each circle represents an SGS transistor.

Figure 7B:
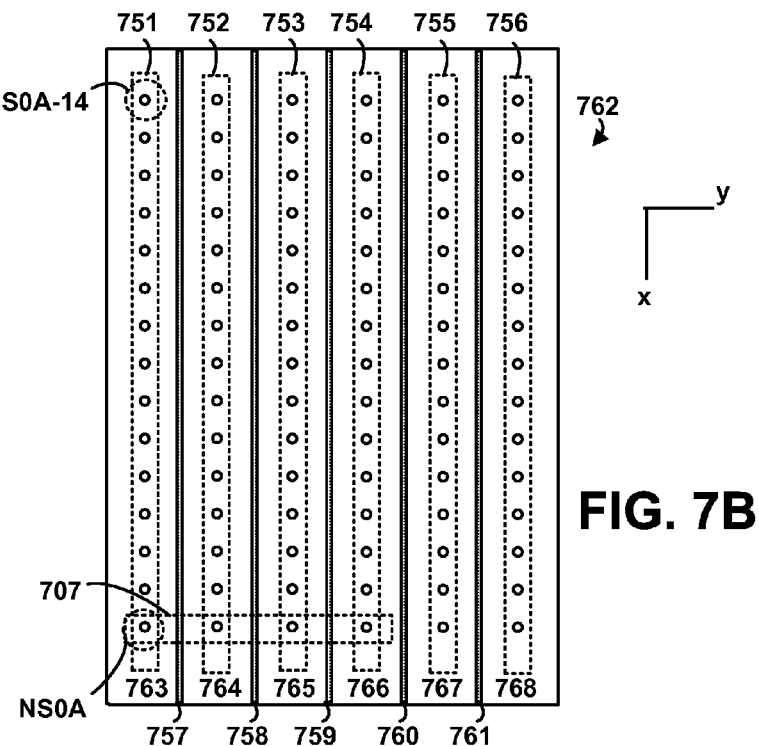
Figure 7C:
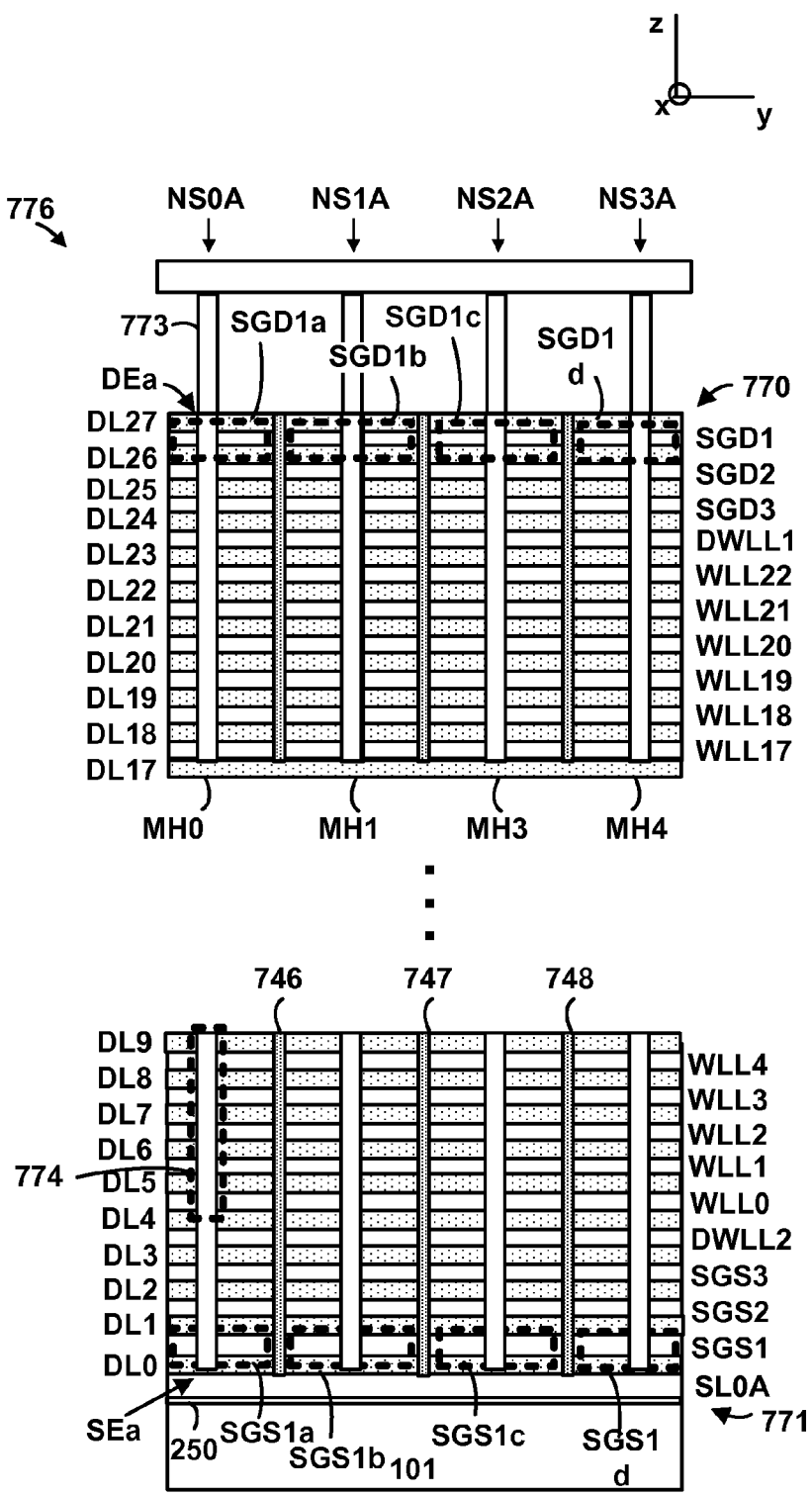

FIG. 7B depicts a top view of an example SGD layer 762, consistent with FIG. 7A. Slits 757, 758, 759, 760 and 761 divide the SGD layer into portions 763, 764, 765, 766, 767 and 768. Each portion connects the SGD transistors in a set of NAND strings. For example, SGD layer portion 763 or line connects the SGD transistors in the set of NAND strings NS0A to NS0A-14. Regions 751, 752, 753, 754, 755 and 756 represent the SGD transistors (as circles) of respective sets of NAND strings in the SGD layer portions 763, 764, 765, 766, 767 and 768, respectively. The portion 707 from FIG. 7A is also repeated. The select gate transistors are associated with NAND strings NS0A-NS5A.

FIG. 7C depicts an embodiment of a stack 776 showing a cross-sectional view of the portion 707 of FIG. 7A, along line 705. In this example, three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 746, 747 and 748 from FIG. 7A are also depicted. A portion of the bit line BL0A is also depicted. A conductive via 773 connects DEa to BL0A. The columns are formed in memory holes MH0-MH4. The memory holes are columnar and extend at least from a top 770 to a bottom 771 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors SGS1a, SGS1b, SGS1c and SGS1d are formed in the SGS1 layer. Regions SGD1a, SGD1b, SGD1c and SGD1d represent SGD transistors.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string.

FIG. 8A depicts a view of the region 774 of FIG. 7C, showing memory cells MC1 to MC5. A number of layers can be deposited along the sidewalls of the column and within each word line layer. These layers can include oxide-nitride-oxide (O—N—O) and polysilicon layers which are deposited, e.g., using atomic layer deposition.

For example, the column includes a charge-trapping layer or film (CTL) 803 such as SiN or other nitride, a tunnel oxide (TNL) 804, a polysilicon body or channel (CH) 805, and a dielectric core (DC) 806. A word line layer includes a block oxide (BOX) 802, a block high-k material 801, a barrier metal 800, and a conductive metal 899, such as tungsten, as a control gate. For example, control gates CG0, CG1, CG2, CG3 and CG4 are provided for the memory cells MC0, MC1, MC2, MC3 and MC4, respectively. In another approach, all of these layers except the metal are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. During an erase operation, the electrons return to the channel.

Each of the memory holes can be filled with a plurality of annular layers comprising a block oxide layer, a charge-trapping layer, a tunneling layer and a channel layer. A core region of each of the memory holes is filled with a body material, and the plurality of annular layers are between the core region and the WLLs in each of the memory holes.

FIG. 8B depicts a cross-section view of the region 774 of FIG. 8A along line 844. Each layer is ring-shaped in one possible approach, except the core filler, which is a cylinder.

Figure 8C:
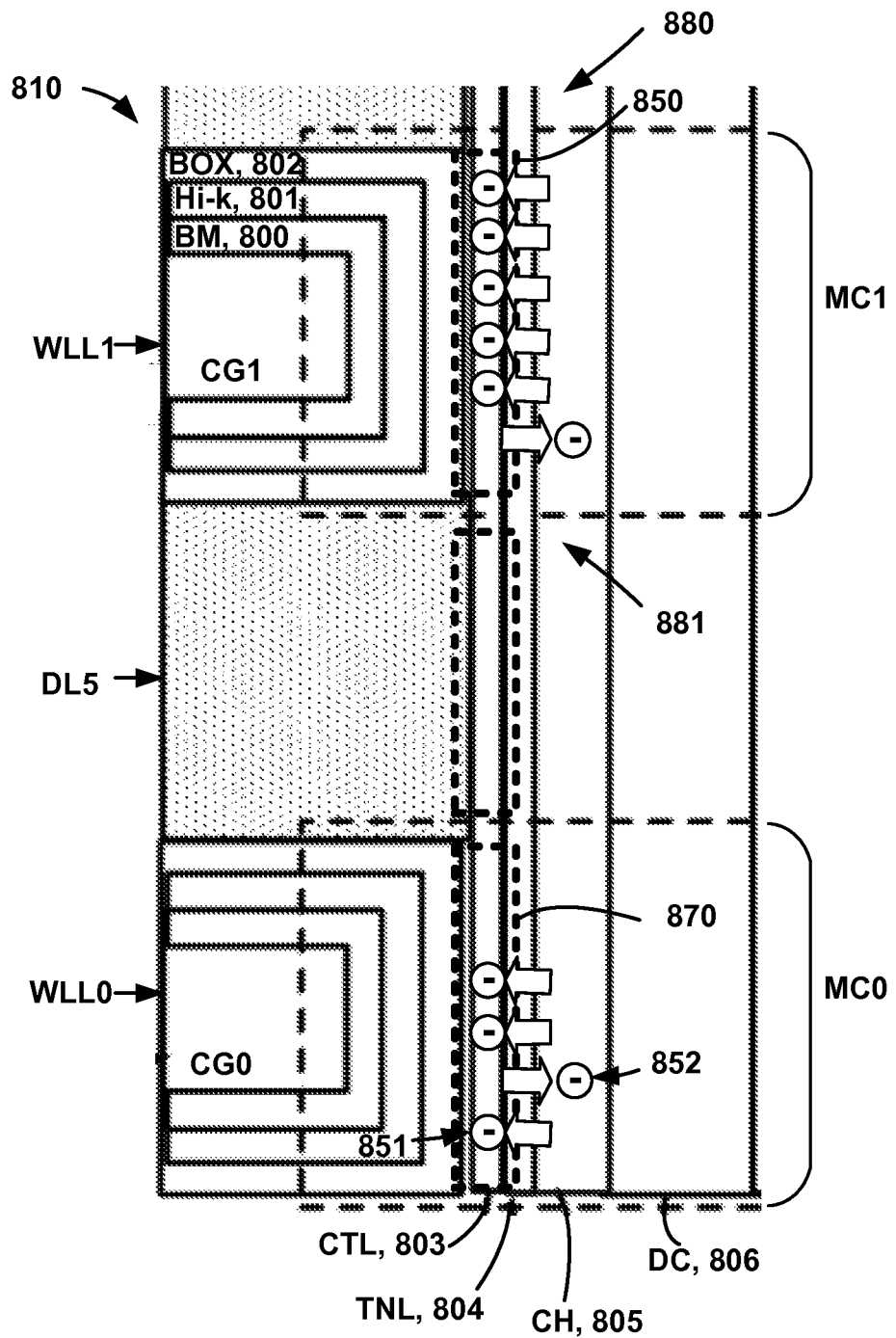
FIG. 8C depicts an expanded view of a portion 810 of the NAND string of FIG. 8A.

FIG. 8C depicts an expanded view of a portion 810 of the NAND string of FIG. 8A. When a program voltage is applied to the control gate of a memory cell via a respective word line, an electric field is generated. In MC0, the electric field causes electrons to tunnel into a region 870 of the charge-trapping layer 803, from the channel 805. Similarly, for MC1, the electric field causes electrons to tunnel into a region 850 of the charge-trapping layer 803, from the channel 805. The movement of the electrons into the charge-trapping layer is represented by the arrows which point to the left. The electrons are represented by circles with a dash inside the circle.

When a memory cell on a selected word line is subsequently read back, control gate read voltages are applied to the memory cell while sensing circuitry determines whether the memory cell is in a conductive state. At the same time, a read pass voltage, Vread (e.g., 8-9 V), is applied to the remaining word lines.

However, the accuracy of the read back operation can be impaired by charge loss in the memory cells. Charge loss is represented by the arrows which point to the right. For example, an electron 852 is an example of a charge which has de-trapped from the charge-trapping region 870, lowering the Vth of MC0. An electron 851 is an example of a charge which remains in the charge-trapping region 870. MC1 has a drain 880, a source 881 and a control gate CG1.

Figure 9:
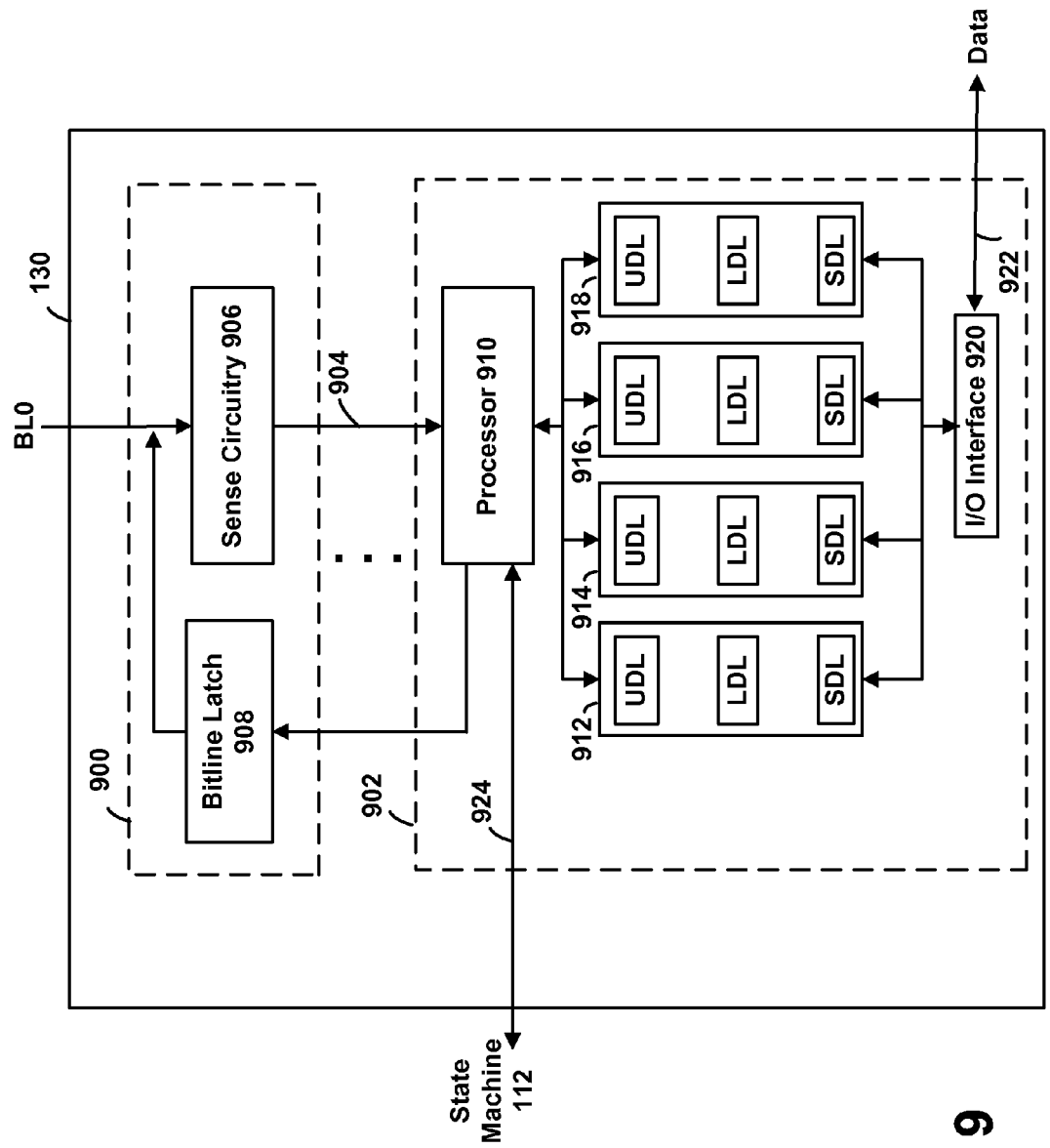
FIG. 9 is a block diagram depicting an embodiment of a sense block of FIG. 1B.

FIG. 9 is a block diagram depicting an embodiment of sense block 130 of FIG. 5. Sense block 130 is partitioned into one or more core portions 900, referred to as sense modules or sense amplifiers, and a common portion 902, referred to as a managing circuit. In an embodiment, there is a separate sense module 900 for each bit line and one common managing circuit 902 for a set of multiple, e.g., four or eight, sense modules 900. Each of sense modules 900 in a group communicates with the associated managing circuit 902 via a data bus 904. Thus, there are one or more managing circuits 902 which communicate with sense modules 900 of a set of memory cells.

Sense module 900 includes sense circuitry 906 that performs sensing by determining whether a conduction current in a connected bit line is above or below a predetermined threshold level. Sense module 900 includes a bit line latch 908 that is used to set a voltage condition on the connected bit line. For example, a predetermined state latched in bit line latch 908 will result in the connected bit line being pulled to a state designating program inhibit (e.g., 1.5-3 V). As an example, flag=0 can inhibit programming, while flag=1 allows programming.

Managing circuit 902 includes a processor 910, four example sets of data latches 912-918, and an I/O Interface 920 coupled between the sets of data latches 912-918 and data bus 922. One set of data latches can be provided for each sense module 900, and data latches identified by SDL, LDL and UDL may be provided for each set. LDL stores a bit for a lower page (LP) of write data, and UDL stores a bit for an upper page (UP) of write data, in a memory which stores two bits of data in each memory cell. SDL stores a bit from a read of a memory cell. During a read operation, the SDL latch first receives the bit and optionally can transfer the bit to the other data latches. Moreover, in one approach, LDL is the only data latch the control circuitry can access so that the LP and UP data are toggled out from the LP latch during a read.

Additional data latches could be used as well. For example, in a three-bit per memory cell implementation, one extra data latch may be used to store a middle page (MP) of data. A four-bit per memory cell implementation can use lower-middle and upper-middle data latches.

Processor 910 performs computations, such as to determine the data stored in the sensed memory cell and store the determined data in the set of data latches 912-918. Each set of data latches 912-918 is used to store data bits determined by processor 910 during a read operation, and to store data bits imported from the data bus 922 during a programming operation which represent write data meant to be programmed into the memory. I/O interface 920 provides an interface between data latches 912-918 and data bus 922.

During reading, the operation of the system is under the control of state machine 112 that controls the supply of different control gate voltages to the addressed memory cell. As it steps through the various predefined control gate voltages corresponding to the various memory states supported by the memory, the sense module may trip at one of these voltages and a corresponding output will be provided from sense module to processor 910 via bus 904. At that point, processor 910 determines the resultant memory state by consideration of the tripping event(s) of the sense module and the information about the applied control gate voltage from the state machine via input lines 924. Processor 910 then computes a binary encoding for the memory state and stores the resultant data bits into data latches 912-918. In another embodiment of the managing circuit 902, bit line latch 908 serves both as a latch for latching the output of the sense module and also as a bit line latch as described above.

Some implementations can include multiple processors 910. In one embodiment, each processor 910 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level.

For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 910 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 912-918 from the data bus 922, in the LP and UP data latches. The programming operation, under the control of state machine 112, comprises a series of program voltage pulses applied to the control gates of the addressed memory cells. Each program pulse is followed by a read back (verify) to determine if the memory cell has been programmed to the desired memory state. In some cases, processor 910 monitors the read back memory state relative to the desired memory state. When the two states agree, processor 910 sets bit line latch 908 to cause the bit line to be pulled to a state designating program inhibit. This inhibits the memory cell coupled to the bit line from further programming even if program pulses appear on its control gate. In other embodiments, processor 910 initially loads bit line latch 908 and sense circuitry 906 sets it to an inhibit value during the verify process.

Each set of data latches 912-918 may be implemented as a stack of data latches for each sense module 900. In an embodiment, there are three data latches 912-918 per sense module 900. In some implementations, data latches 912-918 are implemented as a shift register so that the parallel data stored therein is converted to serial data for data bus 922, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Data latches 912-918 identify when an associated memory cell has reached certain mileposts in a programming operation. For example, data latches 912-918 may identify that the Vth of a memory cell is below a particular verify level. Data latches 912-918 indicate whether a memory cell currently stores one or more bits from a page of data. For example, an LP data latch is flipped (e.g., from 0 to 1) when a lower page bit is stored in an associated memory cell. An UP data latch is flipped when an upper page bit is stored in an associated memory cell. The flipping of a bit occurs when an associated memory cell completes programming, e.g., when its Vth exceeds a target verify level. When lower, middle and upper page bits are used (e.g., in case of three-bit per memory cell memory), the MP data latch is also flipped when a middle page bit is stored in an associated memory cell.

Figure 10A:
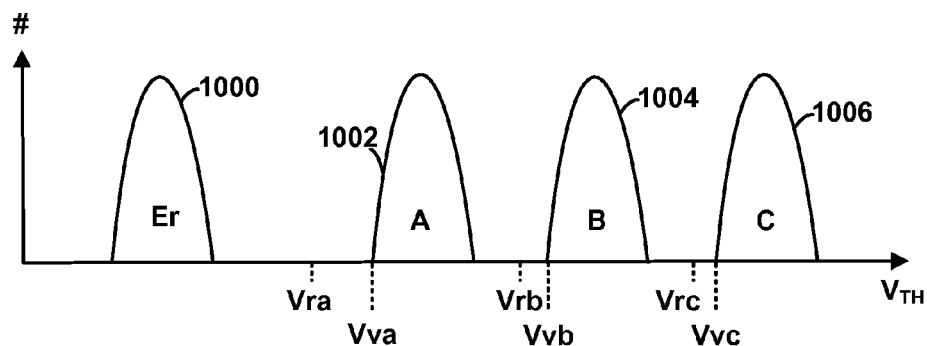
FIG. 10A depicts an embodiment of a set of threshold voltage distributions for a four-state memory device in which each memory cell stores two bits of data.

FIG. 10A depicts an embodiment of a set of Vth distributions for a four-state memory device in which each memory cell stores two bits of data. A first Vth distribution 1000 is provided for erased (Er-state) memory cells. Three Vth distributions 1002, 1004 and 1006 represent programmed states A, B and C, respectively. In an embodiment, the threshold voltages in the Er-state and the threshold voltages in the A, B and C distributions are positive. In another embodiment, the threshold voltage distribution for the Er-state is negative, whereas the threshold voltage distributions for the A-state, B-state and C-state distributions are positive.

Three read reference voltages, Vra, Vrb and Vrc, also are provided for reading data from memory cells. By testing whether the threshold voltage of a given memory cell is above or below Vra, Vrb and Vrc, the system can determine a memory cell's state, e.g., programming condition.

Further, three verify reference voltages, Vva, Vvb and Vvc, are provided. When programming memory cells to the A-state, B-state or C-state, the system will test whether those memory cells have a threshold voltage greater than or equal to Vva, Vvb or Vvc, respectively.

Figure 10B:
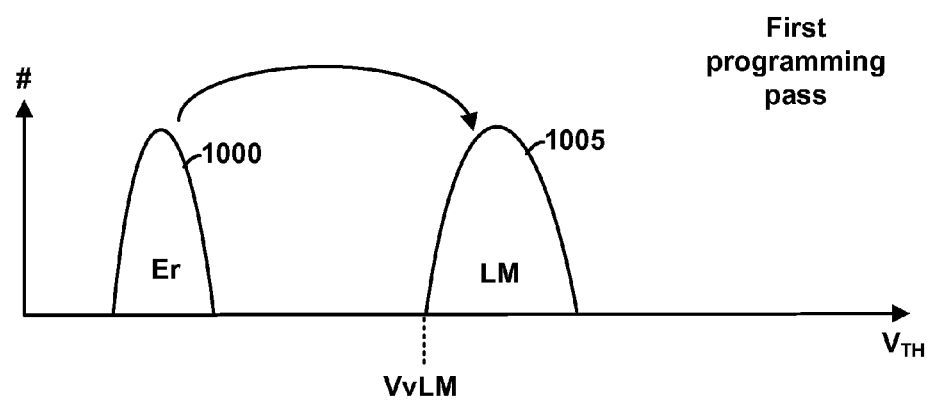
FIG. 10B depicts an embodiment of a first pass of a two-pass programming technique.

In an embodiment known as full sequence programming, memory cells can be programmed from the Er-state directly to any of the programmed states A, B or C. For example, a population of memory cells to be programmed may first be erased so that all memory cells in the population are in the Er-state. A series of program pulses, such as depicted in FIG. 10I, may then be used to program memory cells directly into states A, B or C. Although some memory cells are being programmed from the Er-state to the A-state, other memory cells are being programmed from the Er-state to the B-state and/or from the Er-state to the C-state.

During programming, when the Vth of a memory cell which is being programmed to the A-state as a target state reaches or exceeds Vva, the memory cell is locked out from further programming, such as by raising the associated bit line voltage to a full inhibit level, e.g., 4-6 V. Similarly, when the Vth of a memory cell which is being programmed to the B-state as a target state reaches or exceeds Vvb, the memory cell is locked out from further programming. Likewise, when the Vth of a memory cell which is being programmed to the C-state as a target state reaches or exceeds Vvc, the memory cell is locked out from further programming.

As an alternative to full sequence programming, each memory cell may be programmed in two or more programming passes. FIG. 10B depicts an embodiment of a first pass of a two-pass programming technique. In this example, referred to as LM-fine programming, a multi-bit memory cell stores data for two different pages: a lower page and an upper page. Four states are depicted by repeating the threshold voltage distributions 1000, 1002, 1004 and 1006 from FIG. 10A. These states, and the bits they represent, are: Er-state (11), A-state (01), B-state (00) and C-state (10).

For Er-state, the lower page and upper page both store a "1." For A-state, the lower page stores a "1" and the upper page stores a "0." For B-state, the lower page and the upper page both store "0." For C-state, the lower page stores "0" and the upper page stores "1." Note that although specific bit patterns have been assigned to each of the states in this illustrated example, different bit patterns also may be assigned.

In the first programming pass, the lower page is programmed for a selected word line WLn. If the lower page is to remain data 1, then the memory cell state remains at state Er (distribution 1000). If the lower page is to be programmed to 0, then the threshold voltage of the memory cells on WLn are raised such that the memory cell is programmed to an intermediate (LM or lower-middle) state (distribution 1005).

For example, a series of program pulses, such as depicted in FIG. 10I, may be used to program memory cells from the Er-state to the LM-state. In an embodiment, after a memory cell is programmed from the Er-state to the LM-state, its neighbor memory cell on an adjacent word line WLn+1 in the NAND string will then be programmed with respect to its lower page in a respective first programming pass of the adjacent word line.

Figure 10C:
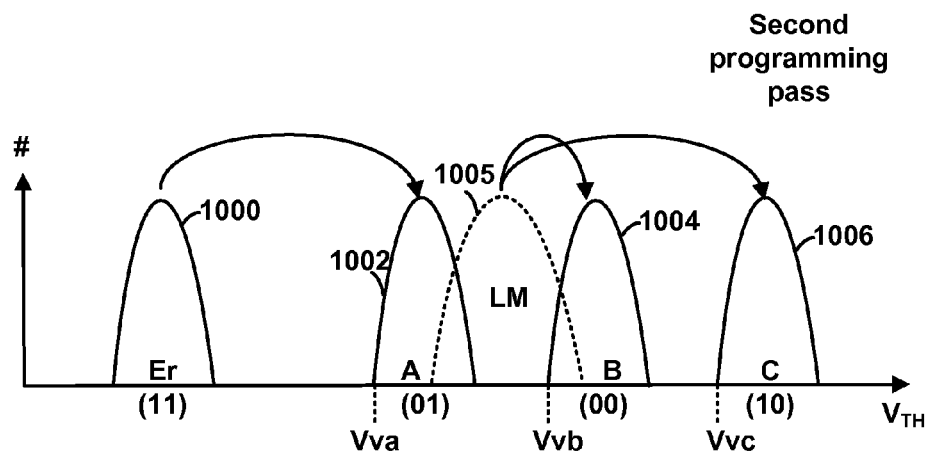
FIG. 10C depicts an embodiment of a second pass of the two-pass programming technique of FIG. 10A.
Figure 10D:
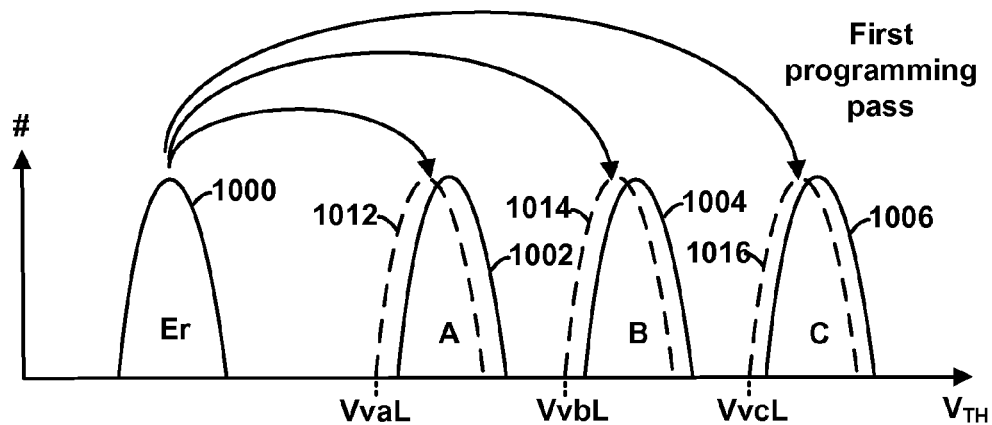
FIG. 10D depicts an embodiment of a first pass of another two-pass programming technique.

FIG. 10C depicts an embodiment of a second pass of the two-pass programming technique referred to in FIG. 10B. The A-state memory cells are programmed from the Er-state distribution 1000 to the A-state distribution 1002. For example, a series of program pulses, such as depicted in FIG. 10I, may be used to program memory cells from the Er-state to the A-state. Likewise, the B-state memory cells are programmed from the LM-state distribution 1005 to the B-state distribution 1004, and the C-state memory cells are programmed from the LM-state distribution 1005 to the C-state distribution 1006. For example, a series of program pulses, such as depicted in FIG. 10I, may be used to program memory cells from the LM-state to the A-state, and from the LM-state to the C-state. This is the fine programming pass.

Persons of ordinary skill in the art will understand that other multi-pass programming techniques may be used. For example, FIG. 10D depicts an embodiment of a first pass of another two-pass programming technique. In this example, referred to as foggy-fine (or course-fine) programming, the A-state, B-state and C-state memory cells are programmed from the Er-state to lower A-state distribution 1012, lower B-state distribution 1014, and lower C-state distribution 1016, using lower verify levels VvaL, VvbL and VvcL, respectively. For example, a series of program pulses, such as depicted in FIG. 10I, may be used to program memory cells from the Er-state to the lower A-state, the lower B-state and the lower C-state. This is the foggy (or course) programming pass. A relatively large program voltage step size may be used, for instance, to quickly program the memory cells to the respective lower verify levels.

Figure 10E:
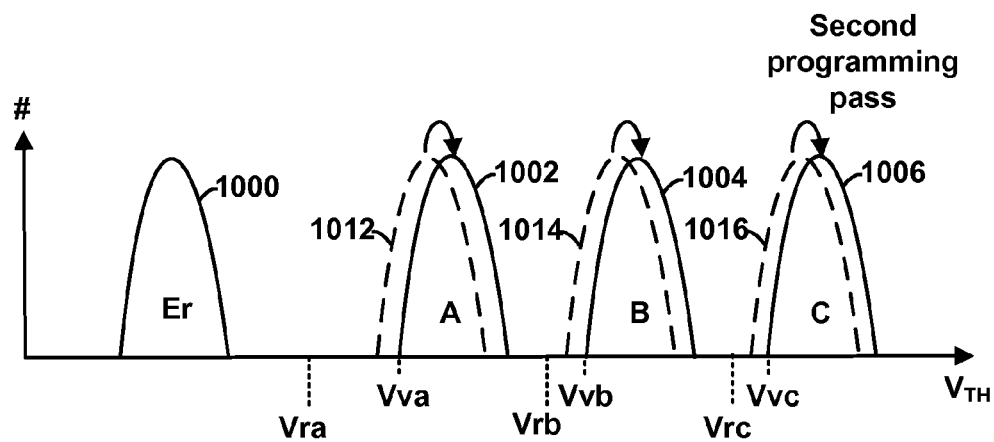
FIG. 10E depicts an embodiment of a second pass of the two-pass programming technique of FIG. 10D.
Figure 10F:
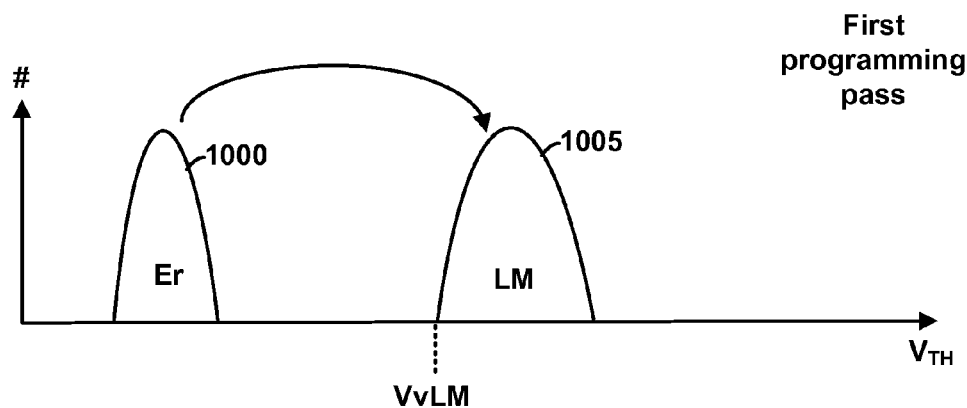
FIG. 10F depicts an embodiment of a first pass of a three-pass programming technique.
Figure 10G:
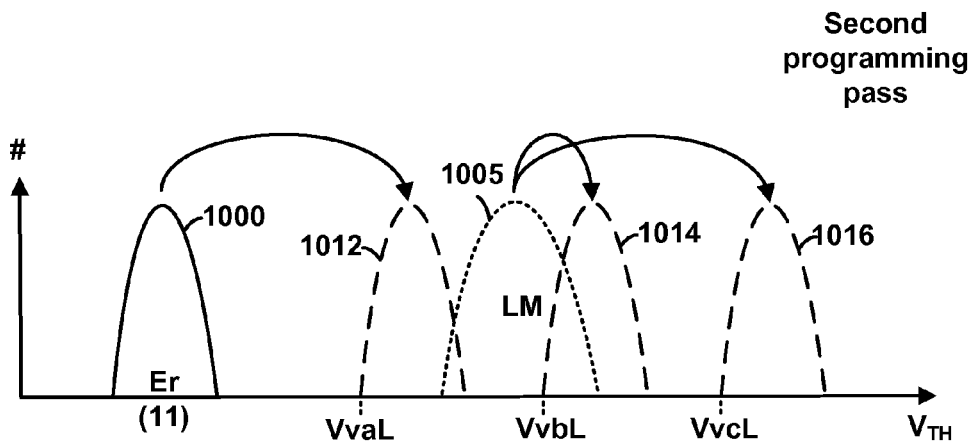
FIG. 10G depicts an embodiment of a second pass of the three-pass programming technique of FIG. 10F.

FIG. 10E depicts an embodiment of a second pass of the two-pass programming technique referred to in FIG. 10D. The A-state, B-state and C-state memory cells are programmed from the lower A-state distribution 1012, lower B-state distribution 1014 and lower C-state distribution 1016 to the A-state distribution 1002, B-state distribution 1004 and C-state distribution 1006, respectively, using the nominal, higher verify levels Vva, Vvb and Vvc, respectively. For example, a series of program pulses, such as depicted in FIG. 10I, may be used to program memory cells from the lower A-state to the A-state, from the lower B-state to the B-state, and from the lower C-state to the C-state. This is the fine programming pass. A relatively small program voltage step size may be used, for instance, to slowly program the memory cells to the respective final verify levels while avoiding a large overshoot.

Persons of ordinary skill in the art will understand that multi-pass programming technique may use more than two programming passes. For example, FIG. 10F depicts an embodiment of a first pass of a three-pass programming technique. In this example, referred to as LM-foggy-fine programming, a multi-state memory cell stores data for two different pages: a lower page and an upper page. Four states are depicted by repeating the threshold voltage distributions 1000, 1002, 1004 and 1006 from FIG. 10A.

These states, and the bits they represent, are: Er-state (11), A-state (01), B-state (00) and C-state (10). For Er-state, the lower page and upper page both store a "1." For A-state, the lower page stores a "1" and the upper page stores a "0." For B-state, the lower page and the upper page both store "0." For C-state, the lower page stores "0" and the upper page stores "1." Note that although specific bit patterns have been assigned to each of the states in this example, different bit patterns also may be assigned.

In the first (LM) programming pass, if the lower page is to remain data 1, then the memory cell state remains at the Er-state (distribution 1000). If the lower page is to be programmed to 0, then the threshold voltage of the memory cells on WLn are raised such that the memory cell is programmed to an LM-state (distribution 1005). For example, a series of program pulses, such as depicted in FIG. 10I, may be used to program memory cells from the Er-state to the LM-state FIG. 10G depicts an embodiment of a second (foggy) pass of the three-pass programming technique referred to in FIG. 10F. The A-state memory cells are programmed from the Er-state distribution 1000 to the lower A-state distribution 1012, the B-state memory cells are programmed from the LM-state distribution 1005 to the lower B-state distribution 1014, and the C-state memory cells are programmed from the LM-state distribution 1005 to the lower C-state distribution 1016, using lower verify levels VvaL, VvbL and VvcL, respectively. For example, a series of program pulses, such as depicted in FIG. 10I, may be used to program memory cells from the Er-state to the lower A-state, from the LM-state to the lower B-state, and from the lower LM state to the C-state.

Figure 10H:
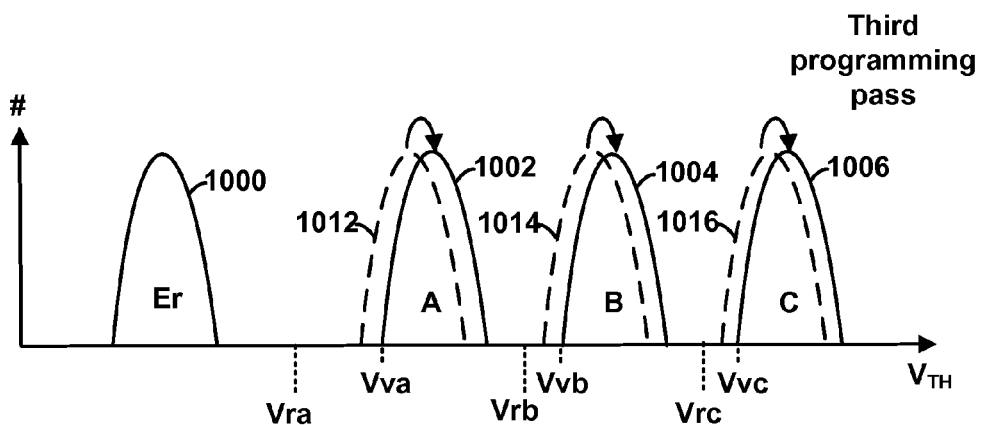
FIG. 10H depicts an embodiment of a third pass of the three-pass programming technique of FIG. 10F.
Figure 10I:
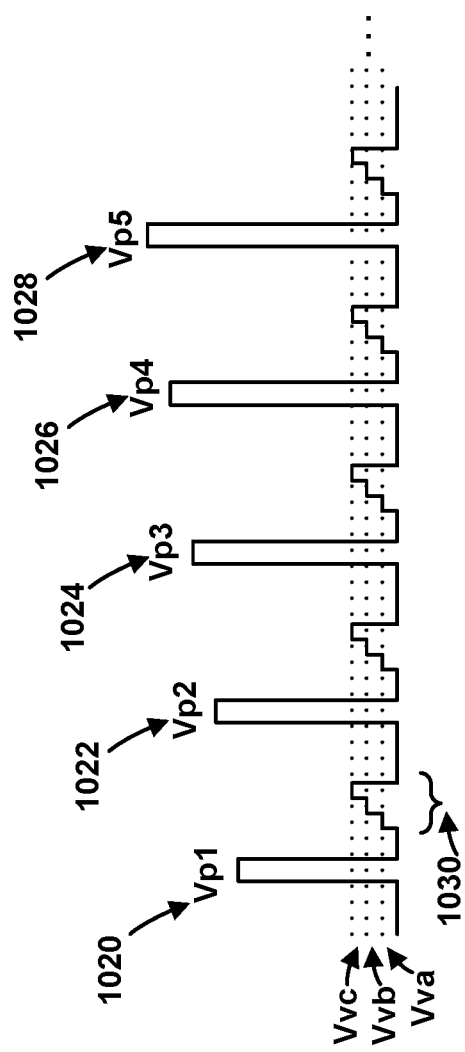
FIG. 10I depicts an embodiment of a series of program and verify pulses which are applied to a selected word line during a programming operation.

FIG. 10H depicts an embodiment of a third (fine) pass of the three-pass programming technique referred to in FIGS. 10E-10G. The A-state, B-state and C-state memory cells are programmed from the respective lower distributions to respective final distributions 1002, 1004 and 1006, respectively, using the nominal, higher verify levels Vva, Vvb and Vvc, respectively. A relatively small program voltage step size may be used, for instance, to slowly program the memory cells to the respective final verify levels while avoiding a large overshoot. For example, a series of program pulses, such as depicted in FIG. 10I, may be used to program memory cells from the lower A-state to the A-state, from the lower B-state to the B-state and from the lower C-state to the C-state.

Although the programming examples depict four data states, two pages of data, and two or three programming passes, the concepts described herein may be applied to other implementations with more than four states, more than two pages, and/or more than three programming passes. For example, memory devices may utilize eight or sixteen states per memory cell. Moreover, in the example programming techniques discussed herein, the Vth of a memory cell may be raised gradually in multiple programming passes as it is programmed to a target data state.

FIG. 10I depicts an embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line.

In an embodiment, the programming pulses are stepped up in successive iterations. Moreover, each programming pulse may have a programming voltage (Vp1, Vp2, . . . ) level, e.g., 12-25 V. For example, as depicted in FIG. 10I, first, second, third, fourth and fifth programming pulses 1020, 1022, 1024, 1026 and 1028 have programming voltage levels of Vp1, Vp2, Vp3, Vp4 and Vp5, respectively. One or more verify voltages 1030, such as verify voltages Vva, Vvb and Vvc, may be provided after each programming pulse.

As described above, in 2D NAND and 3D NAND memory arrays, each word line typically is connected to multiple memory cells, with each memory cell part of a corresponding NAND string. Because each word line is connected to multiple memory cells, during a programming operation of a particular memory cell on a word line, all memory cells on the word line are subjected to the same programming pulses, regardless of whether the other memory cells are also being programmed. Memory cells on the word line that are not intended to be programmed are locked out from programming, such as by raising the associated bit line voltage to a full inhibit level.

As a result of capacitive coupling between adjacent memory cells on the same word line, however, program disturb can occur at inhibited NAND strings during programming of other NAND strings, and sometimes at the programmed NAND string itself. Program disturb occurs when the Vth of an unselected non-volatile memory cell is shifted due to programming of other non-volatile memory cells. Program disturb can occur on previously programmed memory cells as well as erased memory cells that have not yet been programmed. Various program disturb mechanisms can limit the available operating window for non-volatile storage devices such as NAND flash memory.

Figure 11:
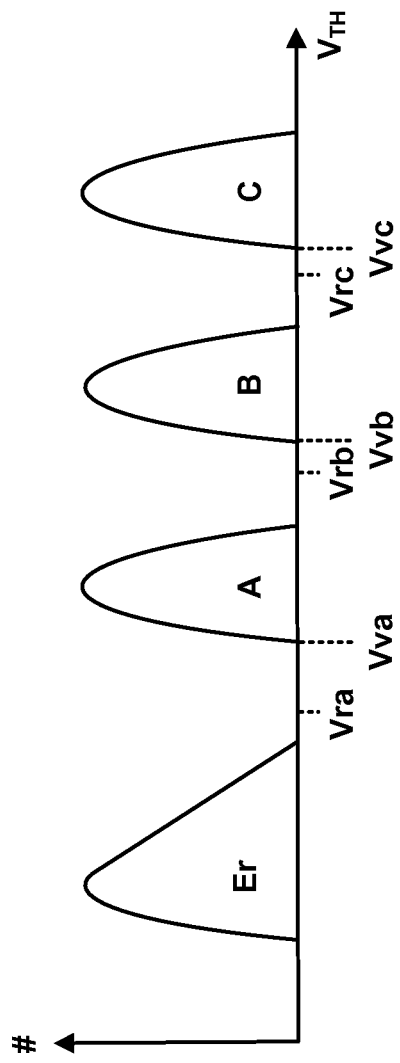
FIG. 11 depicts an embodiment of a set of threshold voltage distributions for a four-state memory device in which each memory cell stores two bits of data.

For example, FIG. 11 illustrates an example Vth distribution in which the Er-state distribution is broadened as a result of program disturb. As a result of such broadening, the margin between Er-state memory cells and A-state memory cells narrows, and impairs the ability to reliably distinguish between the two data states.

In the various multi-pass programming techniques described above, program disturb may be particularly troublesome for slow-to-program and fast-to-program memory cells. For a group of memory cells in a memory array, the number of programming pulses required to reach a particular program state in a particular programming pass is on average about the same. For example, for an array of two-bit memory cells programmed using an LM-fine programming technique, an average of NF programming pulses may be required to reach the LM-state on the first programming pass, and an average of NS programming pulses may be required to reach the B-state on the second programming pass. The values of NF and NS may be determined empirically (e.g., by calculating the averages during use a group of memory cells), or may be user-specified values.

A slow-to-program memory cell is a memory cell in which the number of programming pulses required to reach a particular programming state for a particular programming pass is greater than the average number of programming pulses to reach the particular programming state for the particular programming pass by at least a first predetermined threshold, $TH_1$. A fast-to-program memory cell is a memory cell in which the number of programming pulses required to reach a particular programming state for a particular programming pass is less than the average number of programming pulses to reach the particular programming state for the particular programming pass by at least a second predetermined threshold, $TH_2$.

$TH_1$ and $TH_2$ may be the same for each programming pass, or may be different for different programming passes. For example, Table 1 illustrates example first and second predetermined thresholds for a memory system using a multi-pass programming technique that has three programming passes.

TABLE 1

| 1st Programming Pass | 2nd Programming Pass | 3$^{rd}$ Programming Pass |
|---|---|---|
| $TH_{1,1} = 1$ | $TH_{1,2} = 3$ | $TH_{1,3} = 4$ |
| $TH_{2,1} = 1$ | $TH_{2,2} = 2$ | $TH_{2,3} = 4$ |

As used herein, $TH_{1,x}$ is the first predetermined threshold for the xth programming pass of a multi-pass programming technique, $TH_{2,y}$ is the second predetermined threshold for the yth programming pass of a multi-pass programming technique, $TH_{3,z}$ is the third predetermined threshold for the zth programming pass of a multi-pass programming technique, and so on.

In multi-pass programming techniques, such as those described above, memory cells that are slow-to-program on a first programming pass typically are slow-to-program on subsequent programming passes, and memory cells that are fast-to-program on a first programming pass typically are fast-to-program on subsequent programming passes.

Figure 12:
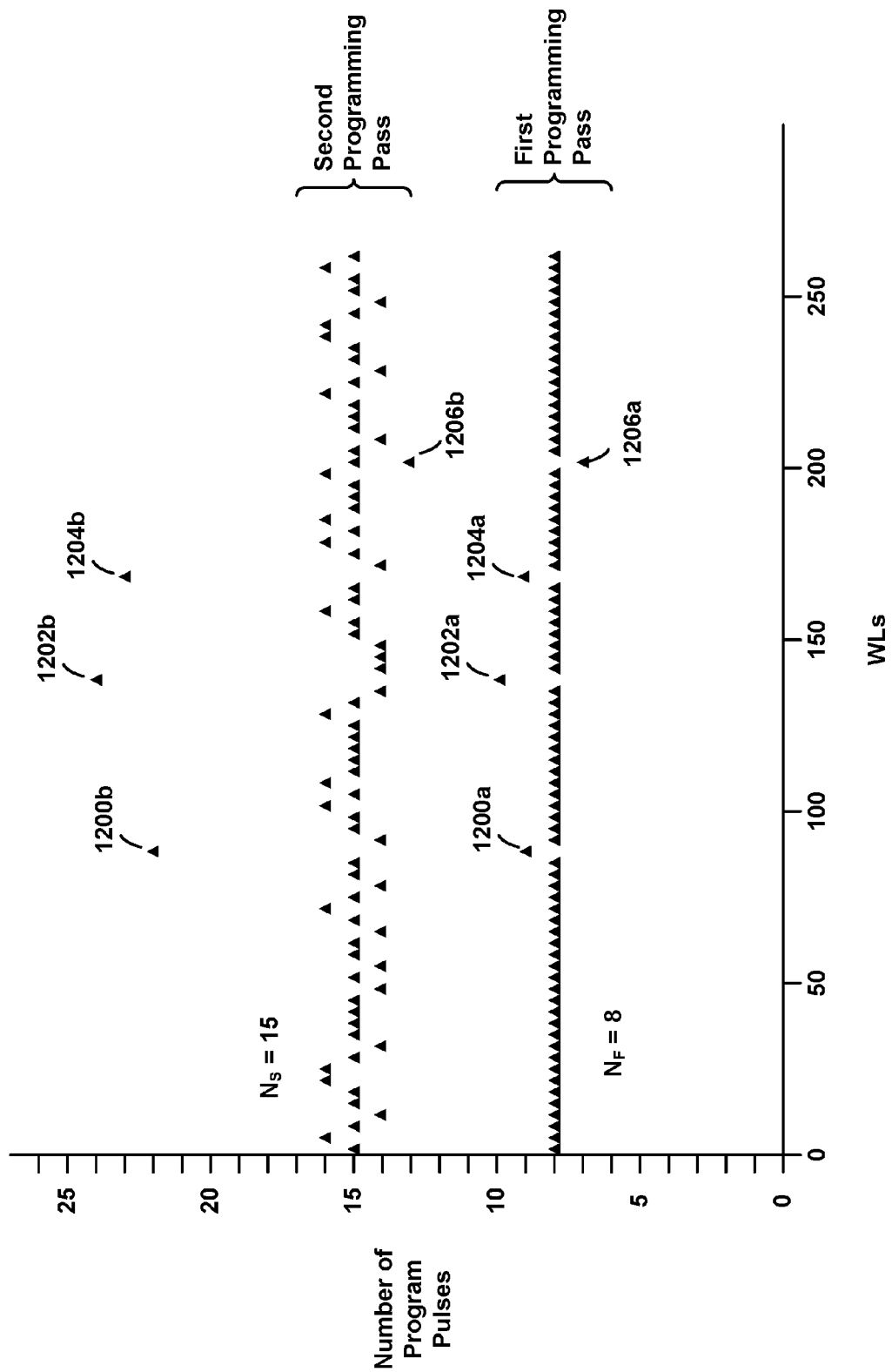
FIG. 12 depicts example programming data for multiple programming passes of memory cells on a group of word lines.

For example, FIG. 12 illustrates example programming data for memory cells on a group of word lines (WLs), where a memory cell on each word line is programmed from a first programming state to a second programming state in a first programming pass, and from the second programming state to a third programming state in a second programming pass. For example, using an LM-fine programming technique, in a first programming pass, the memory cells are programmed from the Er-state to the LM-state, such as illustrated in FIG. 10B, and in a second programming pass, the memory cells are programmed from the LM-state to the B-state, such as illustrated in FIG. 10C.

In the illustrated example, an average of NF=8 programming pulses are required to reach the LM-state from the Er state, and an average of NS=15 programming pulses are required to reach the B-state from the LM state. In the illustrated example, if $TH_{1,1}=1$, memory cells having associated data markers 1200a, 1202a and 1204a require at least one more programming pulse than the NF=8 average number of programming pulses to reach the LM-state in the first programming pass, and thus are slow-to-program memory cells. Likewise, if the $TH_{2,1}=1$, the memory cell having an associated data marker 1206a requires at least one less programming pulse than the NF=8 average number of programming pulses to reach the LM-state in the first programming pass, and thus is a fast-to-program memory cell.

In addition, if the $TH_{1,2}=3$, memory cells having associated data markers 1200b, 1202b and 1204b require at least three more programming pulse than the NS=15 average number of programming pulses to reach the B-state in the second programming pass, and thus are slow-to-program memory cells. Likewise, if $TH_{2,2}=2$, the memory cell having an associated data marker 1206b requires at least two less programming pulse than the NS=15 average number of programming pulses to reach the B-state in the second programming pass, and thus is a fast-to-program memory cell.

FIGS. 13A and 13B depict examples of a series of program and verify pulses which are applied to a selected word line during a two-pass programming operation, such as depicted in FIG. 12. In particular, FIG. 13A depicts example program and verify pulses for a first programming pass for a memory cell that requires NF=8 programming pulses to reach the LM-state from the Er state, and FIG. 13B depicts example program and verify pulses for a second programming pass for the same memory cell that requires NS=15 programming pulses to reach the B-state from the LM state. That is, the memory cell is not a slow-to-program or fast-to-program memory cell. As shown in FIGS. 13A and 13B, the programming pulses are stepped up in successive iterations, with a uniform program step size $\Delta VPGM$ between successive programming pulses, and a uniform pulse width PW for each programming pulse.

FIGS. 14A and 14B depict another example of a series of program and verify pulses which are applied to a selected word line during a two-pass programming operation, such as depicted in FIG. 12. In particular, FIG. 14A depicts example program and verify pulses for a first programming pass for a memory cell that requires NF+x programming pulses to reach the LM-state from the Er state, with x greater than or equal to $TH_{1,1}$, and FIG. 14B depicts example program and verify pulses for a second programming pass for the same memory cell that requires NS+y programming pulses to reach the B-state from the LM state, with y greater than or equal to $TH_{1,2}$. That is, the memory cell is a slow-to-program memory cell. As shown in FIGS. 14A and 14B, the programming pulses are stepped up in successive iterations, with a uniform program step size $\Delta VPGM$ between successive programming pulses, and a uniform pulse width PW for each programming pulse.

Figure 15A:
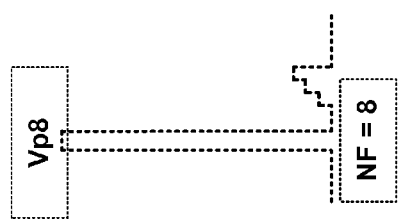
FIGS. 15A and 15B depict still another embodiment of a series of program and verify pulses which are applied to a selected word line during a two-pass programming operation, such as depicted in FIG. 12.
Figure 15A:
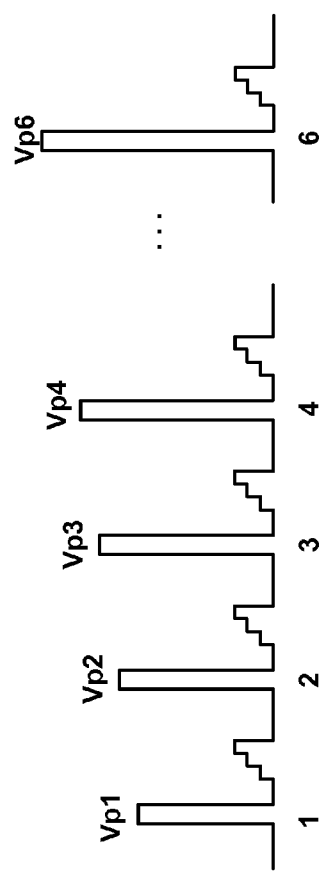
Figure 15B:
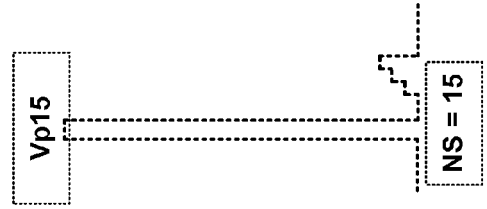
Figure 15B:
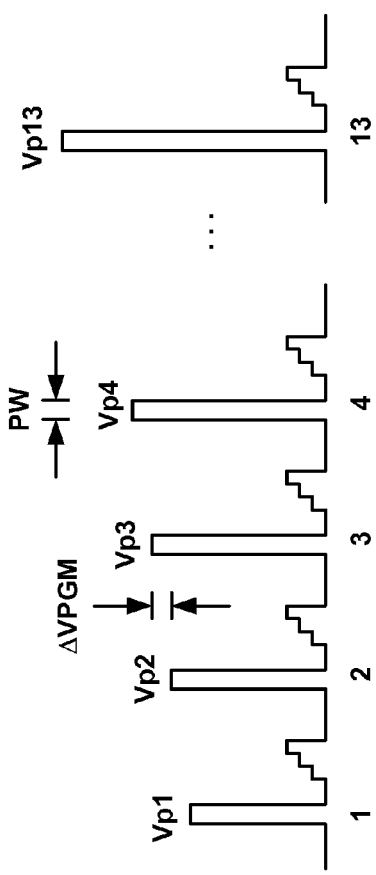

FIGS. 15A and 15B depict still another example of a series of program and verify pulses which are applied to a selected word line during a two-pass programming operation, such as depicted in FIG. 12. In particular, FIG. 15A depicts example program and verify pulses for a first programming pass for a memory cell that requires NF−z=6 programming pulses to reach the LM-state from the Er state, with z less than or equal to $TH_{2,1}$, and FIG. 15B depicts example program and verify pulses for a second programming pass for the same memory cell that requires NS−w=13 programming pulses to reach the B-state from the LM state, with w less than or equal to $TH_{2,2}$. That is, the memory cell is a fast-to-program memory cell. As shown in FIGS. 15A and 15B, the programming pulses are stepped up in successive iterations, with a uniform program step size $\Delta VPGM$ between successive programming pulses, and a uniform pulse width PW for each programming pulse.

In an embodiment of an adaptive multi-pass programming technique in accordance with this technology, a memory cell on a selected word line is programmed in one programming pass to a specified threshold state, a number of programming pulses required to program the memory cell to the specified threshold state is determined, a difference between the determined number of programming pulses and a predetermined average number of programming pulses for the one programming pass and the specified threshold state is determined, and the determined difference is used to adaptively adjust programming pulse parameters for the memory cells in another programming pass.

Figure 16:
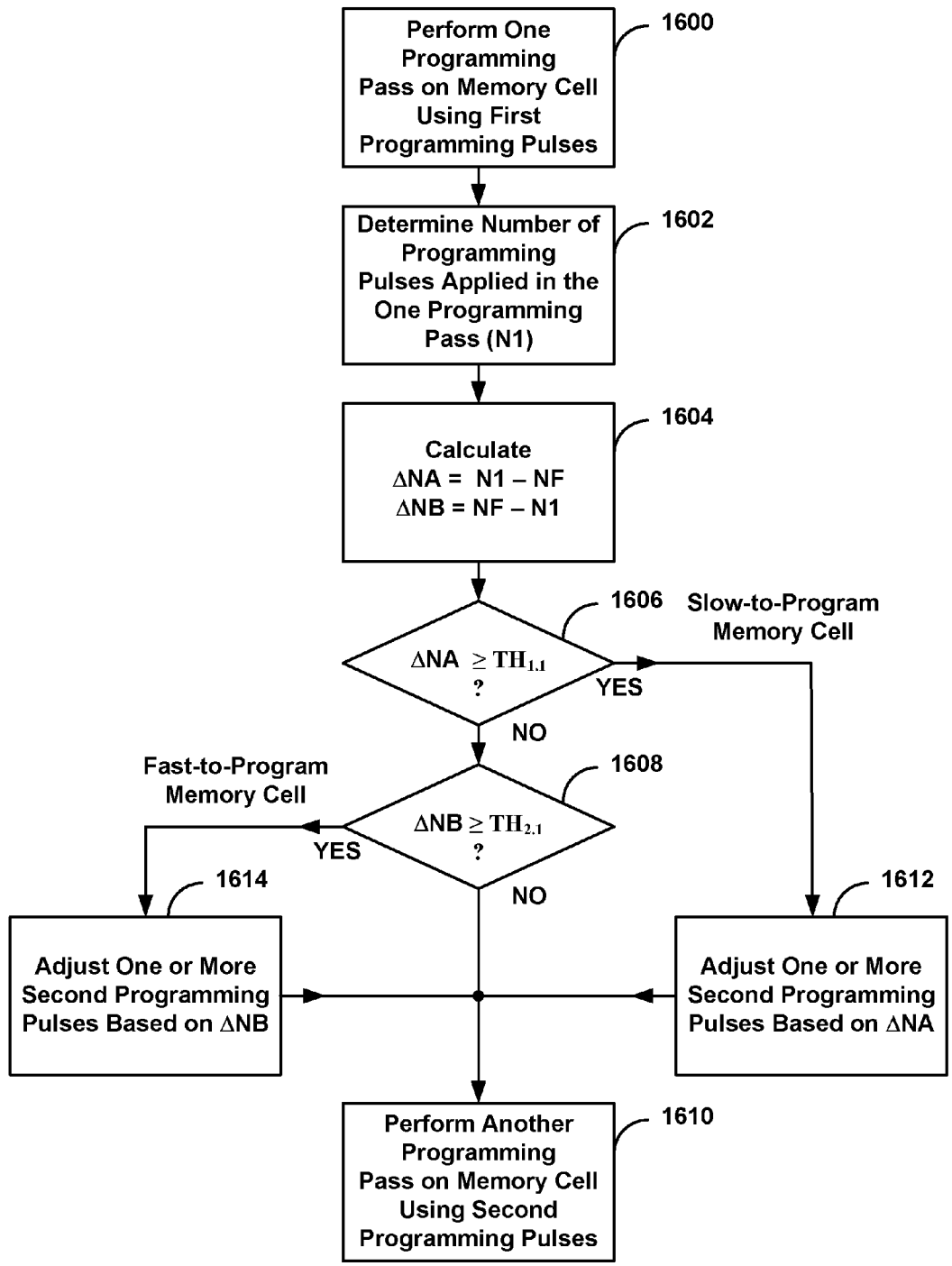
FIG. 16 is an embodiment of an adaptive multi-pass programming technique.
Figure 17A:
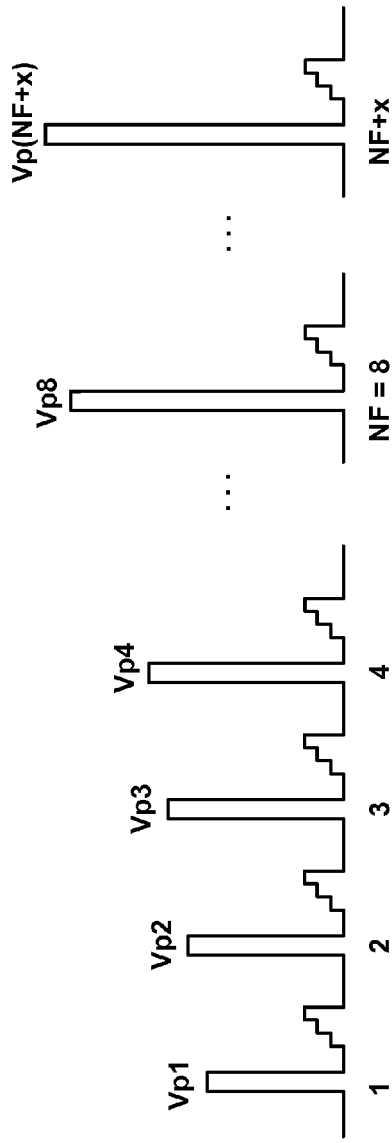
FIGS. 17A and 17B depict an embodiment of a series of program and verify pulses which are applied to a selected word line during the programming operation of FIG. 16.

FIG. 16 depicts a flowchart of an embodiment of an adaptive multi-pass programming technique. At step 1600, a memory cell on a selected word line is programmed to a first specified data state in one programming pass using a first set of step-wise increasing program pulses. For example, the first set of step-wise increasing program pulses can include a series of program-verify iterations, where each iteration comprises a program portion in which the program pulse is applied to the selected word line, followed by a verify portion in which a verify (sensing) operation is performed by applying a verify pulse to the selected word line and activating sensing circuitry. FIG. 17A illustrates an example first set of step-wise increasing program pulses for an example two-bit memory cell programmed to an LM-state from an Er-state, in which the one programming pass is the first programming pass.

Referring again to FIG. 16, at step 1602 a number (N1) of programming pulses applied to the memory cell during the one programming pass is determined. For example, controller 122 of FIG. 1 may increment a counter for each applied programming pulse until the memory cell reaches the specified memory state. Controller 122 may save the determined number N1 of programming pulses in a storage location, such as register 115 of FIG. 1. Referring again to FIG. 17A, in the illustrated example, in which the one programming pass is the first programming pass, the memory cell requires N1=NF+x programming pulses to reach the LM-state from the Er state, where NF is an average number of programming pulses required to reach the LM-state from an Er state on the first programming pass.

Referring again to FIG. 16, at step 1604, a first difference $\Delta NA=N1-NF$ and a second difference $\Delta NB=NF-N1$ are calculated for the one programming pass. For example, controller 122 of FIG. 1 may calculate $\Delta NA$ and $\Delta NB$.

At step 1606, first difference $\Delta NA$ is compared to a first predetermined threshold for the one programming pass. For example, if the one programming pass is the first programming pass, the first predetermined threshold is the first predetermined threshold for the first programming pass, $TH_{1,1}$. If first difference $\Delta NA$ is greater than or equal to $TH_{1,1}$, the memory cell is a slow-to-program memory cell, and the process proceeds to step 1612, described below.

If first difference $\Delta NA$ is not greater than or equal to $TH_{1,1}$, the process proceeds to step 1608, and second difference $\Delta NB$ is compared to a second predetermined threshold for the one programming pass. For example, if the one programming pass is the first programming pass, the second predetermined threshold is the second predetermined threshold for the first programming pass, $TH_{2,1}$. If second difference $\Delta NB$ is greater than or equal to $TH_{2,1}$, the memory cell is a fast-to-program memory cell, and the process proceeds to step 1614, described below.

If second difference $\Delta NB$ is not greater than or equal to $TH_{2,1}$, memory cell is neither a slow-to-program or a fast-to-program memory cell, and the process proceeds to step 1610, and the memory cell is programmed to a second specified data state in another programming pass using a second set of step-wise increasing program pulses. For example, the second set of step-wise increasing program pulses can include a series of program-verify iterations, where each iteration comprises a program portion in which the program pulse is applied to the selected word line, followed by a verify portion in which a verify (sensing) operation is performed by applying a verify pulse to the selected word line and activating sensing circuitry. FIG. 13B illustrates an example second set of step-wise increasing program pulses for an example two-bit memory cell programmed from an LM-state to a B-state, in which the another programming pass is the second programming pass.

Referring again to FIG. 16, if at step 1606 if first difference $\Delta NA$ is greater than or equal to $TH_{1,1}$, the memory cell is a slow-to-program memory cell, and the process proceeds to step 1612. For example, referring again to FIG. 17A, if $x \geq TH_{1,1}$, the memory cell is a slow-to-program memory cell. Referring again to FIG. 16, at step 1612, the second set of step-wise increasing program pulses are adjusted based on first difference $\Delta NA$. In an embodiment, the pulse amplitude and/or the pulse width of one or more program pulses in the second set of step-wise increasing program pulses may be modified based on first difference $\Delta NA$. The particular one or more program pulses in the second set of step-wise increasing program pulses that are adjusted may be user-specified or may be fixed (e.g., the last one, two or three program pulses). Other values may be used.

Figure 17B:
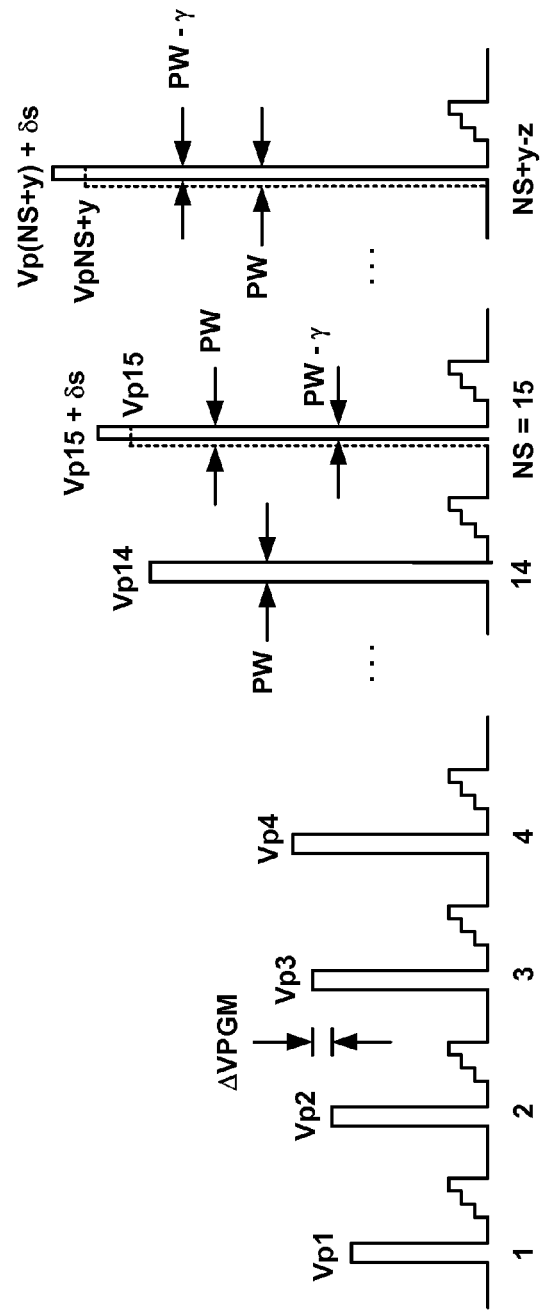

For example, FIG. 17B depicts example program and verify pulses for a second programming pass in which NS=15 programming pulses are the average number of program pulses required to reach the B-state from the LM state. In this example, the amplitude and pulse width of one or more program pulses in the second set of step-wise increasing program pulses have been modified based on first difference $\Delta NA$. In particular, beginning with pulse NS=15, the pulse amplitude for all pulses have been increased by $\delta s$, and the pulse widths have been decreased by $\gamma$, where $\delta s$ and $\gamma$ may be a function of first difference $\Delta NA$. Persons of ordinary skill in the art will understand that the modifications to the pulse amplitude and/or width may begin with pulses prior to or after pulse NS, and that the magnitude of the amplitude and/or pulse width modification may not be the same for each modified pulse.

Referring again to FIG. 16, if at step 1608 if second difference ΔNB is greater than or equal to $TH_{2,1}$, the memory cell is a fast-to-program memory cell, and the process proceeds to step 1614. For example, FIG. 18A illustrates an example first set of step-wise increasing program pulses for an example two-bit memory cell programmed to an LM-state. In the illustrated example, the memory cell requires N1=NF−z programming pulses to reach the LM-state from the Er state, where NF is an average number of programming pulses required to reach the LM-state on the first programming pass. If z≥$TH_{2,1}$, the memory cell is a fast-to-program memory cell.

Referring again to FIG. 16, at step 1614, the second set of step-wise increasing program pulses are adjusted based on second difference ΔNB. In an embodiment, the pulse amplitude of one or more program pulses in the second set of step-wise increasing program pulses may be modified based on second difference ΔNB. The particular one or more program pulses in the second set of step-wise increasing program pulses that are adjusted may be user-specified or may be fixed (e.g., the last one, two or three program pulses). Other values may be used.

For example, FIG. 18B depicts example program and verify pulses for a second programming pass in which NS=15 programming pulses are the average number of program pulses required to reach the B-state from the LM state. In this example, the amplitude of one or more program pulses in the second set of step-wise increasing program pulses have been modified based on second difference ΔNB. In particular, beginning with pulse NS−2=13, the pulse amplitude for all pulses have been increased by δf, where δf may be a function of second difference ΔNB. Persons of ordinary skill in the art will understand that the modifications to the pulse amplitude may begin with pulses prior to or after pulse NS−2, and that the magnitude of the amplitude modification may not be the same for each modified pulse.

The example programming process of FIG. 16 may be performed on a memory array, such as a 2D or 3D memory array in memory structure 126 of FIG. 1, by a controller, such as controller 122 of FIG. 1. In addition, the example programming process of FIG. 16 may be performed for memory cells having two or more bits per cell, and using two or more multi-pass programming techniques. Thus the one programming pass may be the first programming pass and the another programming pass may be the second programming pass, the one programming pass may be the first programming pass and the another programming pass may be the third programming pass, the one programming pass may be the second programming pass and the another programming pass may be the third programming pass, and so on.

Accordingly, it can be seen that, in one embodiment, a method is provided for programming a memory cell connected to a selected word line in a memory device. The method includes performing one programming pass of a multi-pass programming operation for the memory cell, wherein a first set of program pulses is applied to the selected word line during the one programming pass, determining a number of the program pulses applied to the selected word line during the one programming pass, determining a difference between the determined number of program pulses applied to the selected word line during the one programming pass and a predetermined number of program pulses, adjusting a parameter of a second set of program pulses for the another programming pass based on the determined difference, and performing the another programming pass for the set of memory cells, wherein the second set of program pulses is applied to the selected word line during the another programming pass.

In another embodiment, a memory device includes a memory cell connected to a selected word line, and a control circuit. The control circuit is configured to perform one programming pass of a multi-pass programming operation for the memory cell, wherein a first set of program pulses is applied to the selected word line during the one programming pass, determine a number of the program pulses applied to the selected word line during the one programming pass, determine a difference between the determined number of program pulses applied to the selected word line during the one programming pass and a predetermined number of program pulses, adjust a parameter of a second set of program pulses for the another programming pass based on the determined difference, and perform the another programming pass for the set of memory cells, wherein the second set of program pulses is applied to the selected word line during the another programming pass In another embodiment, a method is provided for programming a memory cell connected to a selected word line in a memory device. The method includes performing one programming pass of a multi-pass programming operation for the memory cell, wherein a first set of program pulses is applied to the selected word line during the one programming pass, determining a number of the program pulses applied to the selected word line during the one programming pass, determining a first difference between the determined number of program pulses applied to the selected word line during the one programming pass and a predetermined number of program pulses, determining a second difference between the predetermined number of program pulses and the determined number of program pulses applied to the selected word line during the one programming pass, if the determined first difference is greater than a first predetermined threshold value, adjusting an amplitude, a pulse width or an amplitude and a pulse width of a second set of program pulses for the another programming pass based on the determined first difference, if the determined second difference is greater than a second predetermined threshold value, adjusting an amplitude the second set of program pulses for the another programming pass based on the determined second difference, and performing the another programming pass for the set of memory cells, wherein the second set of program pulses is applied to the selected word line during the another programming pass.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

The invention claimed is:

1. A method comprising:
    performing one programming pass of a multi-pass programming operation of a memory cell by applying a set of program pulses to the memory cell;

determining a number of program pulses applied to the memory cell during the one programming pass;

determining that the memory cell is a slow-to-program memory cell by determining that a difference between the determined number of program pulses and a predetermined number of program pulses exceeds a first predetermined threshold; and performing another programming pass on the memory cell by applying a set of adjusted program pulses to the memory cell, wherein the adjusted program pulses comprise a parameter that is adjusted based on the difference to reduce a number of adjusted program pulses applied to the memory cell during the another programming pass.

2. The method of claim 1, further comprising programming the memory cell to a predetermined programming state during the one programming pass.

3. The method of claim 2, wherein the predetermined number of program pulses comprises an average number of program pulses required to program a plurality of memory cells to the predetermined programming state.

4. The method of claim 2, wherein the predetermined number of program pulses comprises a user-specified value.

5. The method of claim 1, wherein the set of adjusted program pulses comprises one or more user-specified adjusted program pulses.

6. The method of claim 1, wherein the adjusted parameter comprises an amplitude of one or more program pulses.

7. The method of claim 6, wherein the amplitude of the one or more program pulses is adjusted based the determined difference.

8. The method of claim 1, wherein the set of adjusted program pulses comprises one or more user-specified adjusted program pulses.

9. The method of claim 8, wherein the pulse width of the one or more program pulses is adjusted based the determined difference.

10. The method of claim 1, wherein the one programming pass is a first programming pass of the multi-pass programming operation, and the another programming pass is a second programming pass of the multi-pass programming operation.

11. The method of claim 1, wherein the one programming pass is a second programming pass of the multi-pass programming operation and the another programming pass is a third programming pass of the multi-pass programming operation.

12. A device comprising:
a memory cell; and
a control circuit configured to:
  perform one programming pass of a multi-pass programming operation of the memory cell a by applying set of program pulses to the memory cell;
  determine a number of the program pulses applied to the memory cell during the one programming pass;
  determine a difference between the determined number of program pulses and a predetermined number of program pulses; and
  perform another programming pass on the memory cell by applying set of adjusted program pulses to the memory cell, wherein the adjusted program pulses comprise a parameter that is adjusted based on the difference to reduce or increase a number of adjusted program pulses applied to the memory cell during the another programming pass.

13. The memory device of claim 12, wherein the control circuit programs the memory cell to a predetermined programming state during the one programming pass.

14. The memory device of claim 13, wherein the control circuit calculates the predetermined number of program pulses by averaging a number of program pulses required to program a plurality of memory cells to the predetermined programming state.

15. The memory device of claim 12, wherein the control circuit adjusts an amplitude of one or more program pulses of the adjusted program pulses.

16. The memory device of claim 12, wherein the control circuit adjusts a pulse width of one or more program pulses of the adjusted program pulses.

17. A method comprising:
performing one programming pass of a multi-pass programming operation of a memory cell by applying first program pulses to the memory cell;
determining a number of the first program pulses applied to the memory cell during the one programming pass;
determining that the memory cell is a slow-to-program memory cell or a fast-to-program memory cell by:
  determining a first difference between the determined number of first program pulses applied to the memory cell during the one programming pass and a predetermined number of program pulses; and
  determining a second difference between the predetermined number of program pulses and the determined number of first program pulses applied to the memory cell during the one programming pass; and
performing the another programming pass of the memory cell by applying second program pulses to the memory cell, wherein the second program pulses comprise a pulse amplitude that is adjusted based on one of the determined first difference and the determined second difference.

18. The method of claim 17, further comprising programming the memory cell to a predetermined programming state during the one programming pass.

19. The method of claim 18, wherein the predetermined number of program pulses comprises an average number of program pulses required to program a plurality of memory cells to the predetermined programming state.

20. The method of claim 18, wherein the predetermined number of first program pulses comprises a user-specified value.

21. The method of claim 17, wherein the one programming pass is a first programming pass of the multi-pass programming operation, and the another programming pass is a second programming pass of the multi-pass programming operation.

22. The method of claim 17, wherein the one programming pass is a second programming pass of the multi-pass programming operation and the another programming pass is a third programming pass of the multi-pass programming operation.

* * * * *

UNITED STATES PATENT AND TRADEMARK OFFICE
CERTIFICATE OF CORRECTION

PATENT NO.        : 9,496,040 B2
APPLICATION NO.   : 14/602468
DATED             : November 15, 2016
INVENTOR(S)       : R. Paudel et al.

Page 1 of 1

It is certified that error appears in the above-identified patent and that said Letters Patent is hereby corrected as shown below:

In the Claims

Claim 12 (Column 25, Line 53), please change "cell a by" to --cell by--.

Signed and Sealed this
Sixth Day of June, 2017

Michelle K. Lee
*Director of the United States Patent and Trademark Office*